United States Patent
Kim et al.

(10) Patent No.: US 10,629,248 B2
(45) Date of Patent: Apr. 21, 2020

(54) SEMICONDUCTOR DEVICES CONFIGURED TO STORE BANK ADDRESSES AND GENERATE BANK GROUP ADDRESSES

(71) Applicant: SK hynix Inc., Icheon-si, Gyeonggi-do (KR)

(72) Inventors: Woongrae Kim, Icheon-si (KR); Myung Kyun Kwak, Yongin-si (KR); Tae Yong Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/049,424

(22) Filed: Jul. 30, 2018

(65) Prior Publication Data

US 2019/0279696 A1 Sep. 12, 2019

(30) Foreign Application Priority Data

Mar. 12, 2018 (KR) .................. 10-2018-0028439

(51) Int. Cl.
*G11C 8/12* (2006.01)
*G11C 8/18* (2006.01)
*G11C 11/408* (2006.01)

(52) U.S. Cl.
CPC .............. *G11C 8/12* (2013.01); *G11C 8/18* (2013.01); *G11C 11/408* (2013.01); *G11C 11/4087* (2013.01)

(58) Field of Classification Search
CPC ........... G11C 8/12; G11C 8/18; G11C 11/408; G11C 11/4087
See application file for complete search history.

(56) References Cited

U.S. PATENT DOCUMENTS

| | | | | |
|---|---|---|---|---|
| 5,953,280 | A * | 9/1999 | Matsui | G11C 8/12 365/230.03 |
| 2015/0043297 | A1* | 2/2015 | Hong | G11C 8/18 365/230.03 |
| 2015/0213859 | A1* | 7/2015 | Jang | G11C 7/22 365/194 |
| 2015/0310904 | A1 | 10/2015 | Kim et al. | |
| 2019/0138245 | A1* | 5/2019 | Shin | G11C 7/1018 |

FOREIGN PATENT DOCUMENTS

KR 1020100030510 A 3/2010

* cited by examiner

*Primary Examiner* — Jerome Leboeuf
(74) *Attorney, Agent, or Firm* — William Park & Associates Ltd.

(57) ABSTRACT

A semiconductor device includes a bank group selection signal generation circuit and a bank group address generation circuit. The bank group selection signal generation circuit stores a bank address based on a command pulse generated to perform a read operation or a write operation. The bank group selection signal generation circuit outputs the stored bank address as a bank group selection signal. The bank group address generation circuit generates a bank group address and an internal bank group address for performing a column operation of a cell array included in a bank group selected based on the bank group selection signal.

26 Claims, 16 Drawing Sheets

FIG.11

| LBA<4> | LBA<3> |            |
|--------|--------|------------|
| L      | L      | BG<1> = "H" |
| L      | H      | BG<2> = "H" |
| H      | L      | BG<3> = "H" |
| H      | H      | BG<4> = "H" |

SEMICONDUCTOR DEVICES CONFIGURED TO STORE BANK ADDRESSES AND GENERATE BANK GROUP ADDRESSES

CROSS-REFERENCE TO RELATED APPLICATIONS

The present application claims priority under 35 U.S.C. 119(a) to Korean Application No. 10-2018-0028439, filed on Mar. 12, 2018, which is incorporated herein by reference in its entirety.

BACKGROUND

1. Technical Field

Embodiments of the present disclosure generally relate to semiconductor devices, and more particularly, operations performed by a semiconductor device.

2. Related Art

In general, each of the semiconductor devices such as dynamic random access memory (DRAM) devices may include a plurality of bank groups comprised of cell arrays which are selected by addresses. Each of the bank groups may be realized to include a plurality of banks. The semiconductor devices may perform a column operation that selects any one of the plurality of bank groups and outputs data stored in the cell array included in the selected bank group through input/output (I/O) lines.

SUMMARY

According to an embodiment, a semiconductor device may be provided. The semiconductor device may include a bank group selection signal generation circuit and a bank group address generation circuit. The bank group selection signal generation circuit may be configured to store a bank address based on a command pulse generated to perform a read operation or a write operation. The bank group selection signal generation circuit may be configured to output the stored bank address as a bank group selection signal at a moment different from a moment that the bank address is stored. The bank group address generation circuit may be configured to generate a bank group address and an internal bank group address for performing a column operation of a cell array included in a bank group selected based on the bank group selection signal.

According to an embodiment, a semiconductor device may be provided. The semiconductor device may include an input control pulse generation circuit configured to generate an input control pulse based on a command pulse, an output control pulse generation circuit configured to generate an output control pulse and an internal output control pulse based on the command pulse, and a bank group selection signal generation circuit configured to store a bank address based on the input control pulse and configured to receive the output control pulse and the internal output control pulse to output the stored bank address as a bank group selection signal at a moment different from a moment that the bank address is stored. The input control pulse may control an operation for the bank address being inputted to the bank group selection signal generation circuit. The output control pulse and the internal output control pulse may control an operation for the bank address being outputted from the bank group selection signal generation circuit.

BRIEF DESCRIPTION OF THE DRAWINGS

FIG. 11 is a table illustrating an operation of the bank decoder shown in FIG. 10.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Double data rate 5 synchronous dynamic random access memory (DDR5 SDRAM) devices may provide a bank group mode, an 8 bank mode and a 16 bank mode. A bank group may include a plurality of banks. For example, the bank group may include four banks. In the bank group mode, a column operation for one bank included in the bank group may be performed by one command. In the 8 bank mode, column operations for two banks respectively included in separate bank groups are sequentially performed by one command. In the 16 bank mode, column operations for four banks respectively included in separate bank groups are sequentially performed by one command.

Figure 1:
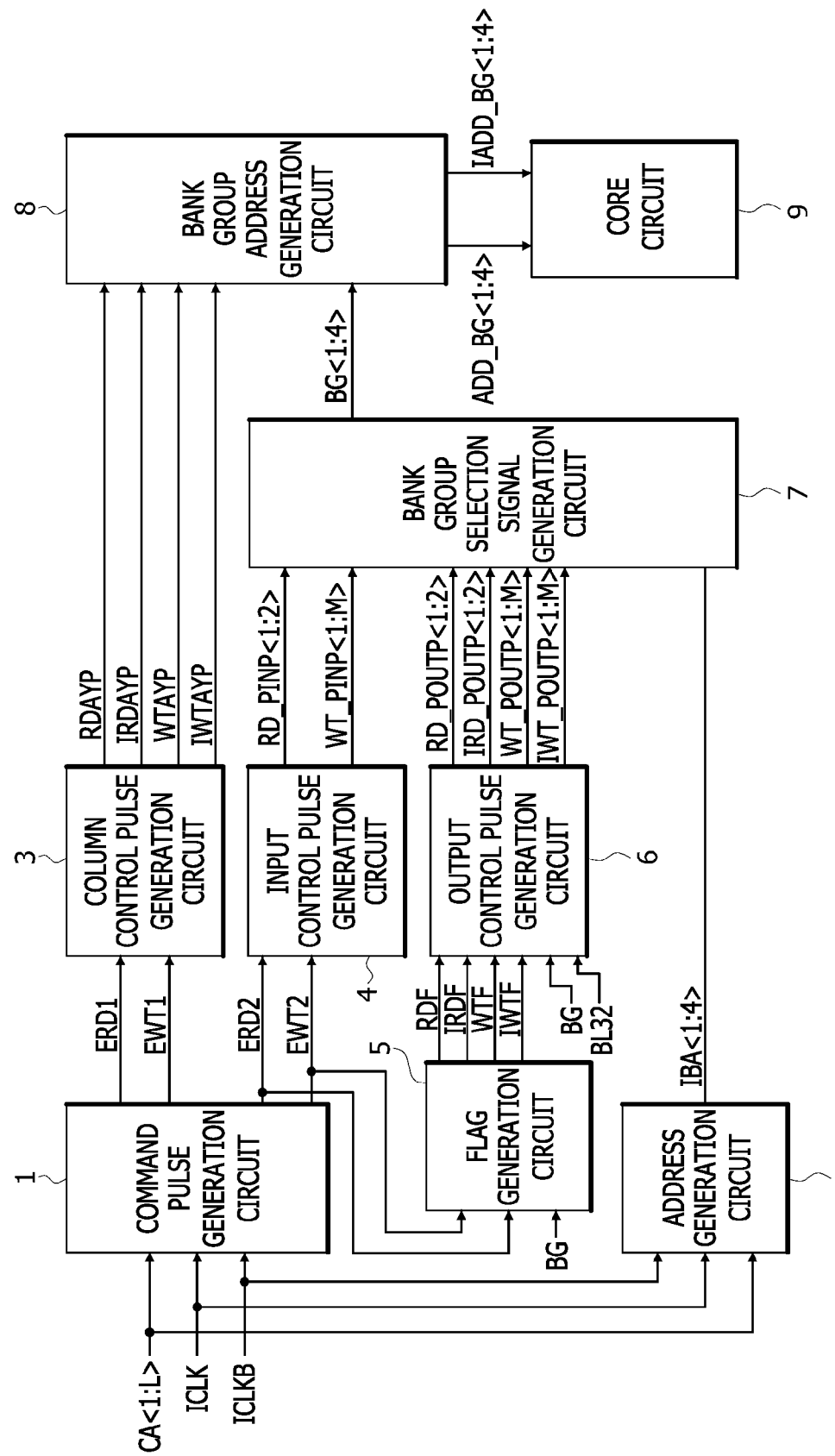
FIG. 1 is a block diagram illustrating a configuration of a semiconductor device according to an embodiment of the present disclosure.

Referring to FIG. 1, a semiconductor device according to an embodiment may include a command pulse generation circuit 1, an address generation circuit 2, a column control pulse generation circuit 3, an input control pulse generation circuit 4, a flag generation circuit 5, an output control pulse generation circuit 6, a bank group selection signal generation circuit 7, a bank group address generation circuit 8 and a core circuit 9.

The command pulse generation circuit 1 may generate a first read command pulse ERD1 (i.e., command pulse), a first write command pulse EWT1 (i.e., command pulse), a second read command pulse ERD2 (i.e., command pulse) and a second write command pulse EWT2 (i.e., command pulse) in response to first to $L^{th}$ external control signals CA<1:L>, an internal clock signal ICLK and an inverted internal clock signal ICLKB. The first to $L^{th}$ external control signals CA<1:L> may include a command and an address that are provided by an external device. The internal clock signal ICLK may be toggled in synchronization with a rising edge of a clock signal (not illustrated) that is provided by the external device or another external device. The inverted internal clock signal ICLKB may be toggled in synchronization with a falling edge of the clock signal (not illustrated). The number 'L' of bits included in the first to $L^{th}$ external control signals CA<1:L> may be set to be different according to the embodiments.

The command pulse generation circuit 1 may decode the first to $L^{th}$ external control signals CA<1:L> in synchronization with the internal clock signal ICLK or the inverted internal clock signal ICLKB to generate the first read command pulse ERD1 and the second read command pulse ERD2 for execution of a read operation. In an embodiment, the command pulse generation circuit 1 may decode the first to $L^{th}$ external control signals CA<1:L> in synchronization with the internal clock signal ICLK to generate the first read command pulse ERD1 and may shift the first read command pulse ERD1 in synchronization with the inverted internal clock signal ICLKB to generate the second read command pulse ERD2, in order to perform the read operation. A point of time that the first read command pulse ERD1 is generated for the read operation may be determined as a point of time that the first to $L^{th}$ external control signals CA<1:L> having a first predetermined logic level combination is inputted to the command pulse generation circuit 1 in synchronization with a rising edge of the internal clock signal ICLK.

The command pulse generation circuit 1 may decode the first to $L^{th}$ external control signals CA<1:L> in synchronization with the internal clock signal ICLK or the inverted internal clock signal ICLKB to generate the first write command pulse EWT1 and the second write command pulse EWT2 for execution of a write operation. In an embodiment, the command pulse generation circuit 1 may decode the first to $L^{th}$ external control signals CA<1:L> in synchronization with the internal clock signal ICLK to generate the first write command pulse EWT1 and may shift the first write command pulse EWT1 in synchronization with the inverted internal clock signal ICLKB to generate the second write command pulse EWT2, in order to perform the write operation. A point of time that the first write command pulse EWT1 is generated for the write operation may be determined as a point of time that the first to $L^{th}$ external control signals CA<1:L> having a second predetermined logic level combination is inputted to the command pulse generation circuit 1 in synchronization with a rising edge of the internal clock signal ICLK.

The address generation circuit 2 may generate first to fourth bank addresses IBA<1:4> in response to the first to $L^{th}$ external control signals CA<1:L>, the internal clock signal ICLK and the inverted internal clock signal ICLKB. The address generation circuit 2 may decode the first to $L^{th}$ external control signals CA<1:L> in synchronization with the internal clock signal ICLK or the inverted internal clock signal ICLKB to generate the first to fourth bank addresses IBA<1:4>. A logic level combination of the first to fourth bank addresses IBA<1:4> may be determined as a logic level combination of some signals among the first to $L^{th}$ external control signals CA<1:L> that is inputted to the address generation circuit 2 in synchronization with a rising edge of the internal clock signal ICLK or the inverted internal clock signal ICLKB.

The column control pulse generation circuit 3 may generate a read column control pulse RDAYP, an internal read column control pulse IRDAYP, a write column control pulse WTAYP and an internal write column control pulse IWTAYP in response to the first read command pulse ERD1 and the first write command pulse EWT1.

The column control pulse generation circuit 3 may generate the read column control pulse RDAYP and the internal read column control pulse IRDAYP in response to the first read command pulse ERD1. The column control pulse generation circuit 3 may sequentially generate the read column control pulse RDAYP and the internal read column control pulse IRDAYP after a third predetermined period elapses from a point of time that the first read command pulse ERD1 occurs. The column control pulse generation circuit 3 may shift the first read command pulse ERD1 by the third predetermined period to generate the read column control pulse RDAYP. The first predetermined period by which the first read command pulse ERD1 is shifted may be set according to a read latency. The first predetermined period by which the first read command pulse ERD1 is shifted may be set to be different according to the embodiments. The column control pulse generation circuit 3 may shift the read column control pulse RDAYP by a fourth predetermined period to generate the internal read column control pulse IRDAYP. The fourth predetermined period by which the read column control pulse RDAYP is shifted may be a period which is set to perform a column operation according to a burst length. The fourth predetermined period by which the read column control pulse RDAYP is shifted may be set to be different according to the embodiments.

The column control pulse generation circuit 3 may generate the write column control pulse WTAYP and the internal write column control pulse IWTAYP in response to the first write command pulse EWT1. The column control pulse generation circuit 3 may sequentially generate the write column control pulse WTAYP and the internal write column control pulse IWTAYP after a fifth predetermined period elapses from a point of time that the first write command pulse EWT1 occurs. The column control pulse generation circuit 3 may shift the first write command pulse EWT1 by the fifth predetermined period to generate the write column control puke WTAYP. The fifth predetermined period by which the first write command pulse EWT1 is shifted may be set according to a write latency. The fifth predetermined period by which the first write command pulse EWT1 is shifted may be set to be different according to the embodiments. The column control pulse generation circuit 3 may shift the write column control pulse WTAYP by a sixth predetermined period to generate the internal write column control pulse IWTAYP. The sixth predetermined period by which the write column control pulse WTAYP is shifted may be a period which is set to perform the column operation according to the burst length. The sixth predetermined period by which the write column control pulse WTAYP is shifted may be set to be different according to the embodiments. In some other embodiments, the column control pulse generation circuit 3 may be configured to generate the read column control pulse RDAYP, the internal read column control pulse IRDAYP, the write column control pulse WTAYP and the internal write column control pulse IWTAYP in response to the second read command pulse ERD2 and the second write command pulse EWT2.

The input control pulse generation circuit 4 may generate first and second read input control pulses RD_PINP<1:2> and first to $M^{th}$ write input control pulses WT_PINP<1:M> in response to the second read command pulse ERD2 and the second write command pulse EWT2.

The input control pulse generation circuit 4 may alternately generate the first and second read input control pulses RD_PINP<1:2> whenever the second read command pulse ERD2 occurs. For example, the input control pulse generation circuit 4 may generate the first read input control pulse RD_PINP<1> if the second read command pulse ERD2 occurs first, may generate the second read input control pulse RD_PINP<2> if the second read command pulse ERD2 occurs second, and may generate the first read input control pulse RD_PINP<1> if the second read command pulse ERD2 occurs third.

The input control pulse generation circuit 4 may sequentially and repeatedly generate the first to $M^{th}$ write input control pulses WT_PINP<1:M> whenever the second write command pulse EWT2 occurs. For example, the input control pulse generation circuit 4 may generate the first write input control pulse WT_PINP<1> if the second write command pulse EWT2 occurs first, may generate the second write input control pulse WT_PINP<2> if the second write command pulse EWT2 occurs second, may generate the $M^{th}$ write input control pulse WT_PINP<M> if the second write command pulse EWT2 'occurs 'M'th, and may generate the first write input control pulse WT_PINP<1> again if the second write command pulse EWT2 occurs '(M+1)'th. In some other embodiments, the input control puke generation circuit 4 may be configured to generate the first and second read input control pulses RD_PINP<1:2> and the first to $M^{th}$ write input control pulses WT_PINP<1:M> in response to the first read command pulse ERD1 and the first write command pulse EWT1.

The flag generation circuit 5 may generate a read flag RDF (i.e., flag), an internal read flag IRDF (i.e., internal flag), a write flag WTF (i.e., flag) and an internal write flag IWTF (i.e., internal flag) in response to the second read command pulse ERD2 and the second write command pulse EWT2 and a mode signal BG. The mode signal BG may be enabled in the bank group mode.

The flag generation circuit 5 may generate the read flag RDF and the internal read flag IRDF in response to the second read command pulse ERD2 and the mode signal BG. The flag generation circuit 5 may generate the read flag RDF after a seventh predetermined period elapses from a point of time that the second read command pulse ERD2 occurs. The flag generation circuit 5 may shift the second read command pulse ERD2 by the seventh predetermined period to generate the read flag RDF. The seventh predetermined period by which the second read command pulse ERD2 is shifted may be set according to the read latency. The seventh predetermined period by which the second read command pulse ERD2 is shifted may be set to be different according to the embodiments. The flag generation circuit 5 may shift the read flag RDF by an eighth predetermined period to generate the internal read flag IRDF while the mode signal BG is enabled. The eighth predetermined period by which the read flag RDF is shifted may be a period which is set to perform the column operation according to the burst length. The eighth predetermined period by which the read flag RDF is shifted may be set to be different according to the embodiments.

The flag generation circuit 5 may generate the write flag WTF and the internal write flag IWTF in response to the second write command pulse EWT2 and the mode signal BG. The flag generation circuit 5 may generate the write flag WTF after a ninth predetermined period elapses from a point of time that the second write command pulse EWT2 occurs. The flag generation circuit 5 may shift the second write command pulse EWT2 by the ninth predetermined period to generate the write flag WTF. The ninth predetermined period by which the second write command pulse EWT2 is shifted may be set according to the write latency. The ninth predetermined period by which the second write command pulse EWT2 is shifted may be set to be different according to the embodiments. The flag generation circuit 5 may shift the write flag WTF by a tenth predetermined period to generate the internal write flag IWTF while the mode signal BG is enabled. The tenth predetermined period by which the write flag WTF is shifted may be a period which is set to perform the column operation according to the burst length. The tenth predetermined period by which the write flag WTF is shifted may be set to be different according to the embodiments.

The output control pulse generation circuit 6 may generate first and second read output control pulses RD_POUTP<1:2> (i.e., output control pulses), first and second internal read output control pulses IRD_POUTP<1:2> (i.e., internal output control pulses), first to $M^{th}$ write output control pulses WT_POUTP<1:M> (i.e., output control pulses) and first to $M^{th}$ internal write output control pulses IWT_POUTP<1:M> (i.e., internal output control pulses) in response to the read flag RDF, the internal read flag IRDF, the write flag WTF, the internal write flag IWTF, the mode signal BG and a burst length signal BL32. The burst length signal BL32 may be enabled if the burst length is set to be '32'.

The output control pulse generation circuit 6 may alternately generate the first and second read output control pulses RD_POUTP<1:2> whenever the read flag RDF occurs. For example, the output control pulse generation circuit 6 may generate the first read output control pulse RD_POUTP<1> if the read flag RDF occurs first, may generate the second read output control pulse RD_POUTP<2> if the read flag RDF occurs second, and may generate the first read output control pulse RD_POUTP<1> again if the read flag RDF occurs third.

The output control pulse generation circuit 6 may alternately generate the first and second internal read output control pulses IRD_POUTP<1:2> whenever the read flag RDF or the internal read flag IRDF occurs. For example, the output control pulse generation circuit 6 may generate the first internal read output control pulse IRD_POUTP<1> if the read flag RDF or the internal read flag IRDF occurs first, may generate the second internal read output control pulse IRD_POUTP<2> if the read flag RDF or the internal read flag IRDF occurs second, and may generate the first internal read output control pulse IRD_POUTP<1> again if the read flag RDF or the internal read flag IRDF occurs third. The output control pulse generation circuit 6 may control generation of the first and second internal read output control pulses IRD_POUTP<1:2> according to the burst length in the bank group mode. For example, the output control pulse generation circuit 6 may sequentially generate the first and second internal read output control pulses IRD_POUTP<1:2> according to the internal read flag IRDF if the burst length is set to be '32' in the bank group mode and may terminate the generation of the first and second internal read output control pulses IRD_POUTP<1:2> if the semiconductor device is out of the bank group mode or the burst length is not set to be '32'.

The output control pulse generation circuit 6 may sequentially and repeatedly generate the first to $M^{th}$ write output control pulses WT_POUTP<1:M> whenever the write flag WTF occurs. For example, the output control pulse generation circuit 6 may generate the first write output control pulse WT_POUTP<1> if the write flag WTF occurs first, may generate the second write output control pulse WT_POUTP<2> if the write flag WTF occurs second, may generate the $M^{th}$ write output control pulse WT_POUTP<M> if the write flag WTF occurs 'M'th, and may generate the first write output control pulse WT_POUTP<1> again if the write flag WTF occurs '(M+1)'th.

The output control pulse generation circuit 6 may sequentially and repeatedly generate the first to $M^{th}$ internal write output control pulses IWT_POUTP<1:M> whenever the write flag WTF or the internal write flag IWTF occurs. For example, the output control pulse generation circuit 6 may generate the first internal write output control pulse IWT_POUTP<1> if the write flag WTF or the internal write flag IWTF occurs first, may generate the second internal write output control pulse IWT_POUTP<2> if the write flag WTF or the internal write flag IWTF occurs second, may generate the $M^{th}$ internal write output control pulse IWT_POUTP<M> if the write flag WTF or the internal write flag IWTF occurs 'M'th, and may generate the first internal write output control pulse IWT_POUTP<1> again if the write flag WTF or the internal write flag IWTF occurs '(M+1)'th. The output control pulse generation circuit 6 may control generation of the first to $M^{th}$ internal write output control pulses IWT_POUTP<1:M> according to the burst length in the bank group mode. For example, output control pulse generation circuit 6 may sequentially generate the first and $M^{th}$ internal write output control pulses IWT_POUTP<1:M> according to the internal write flag IWTF if the burst length is set to be '32' in the bank group mode and may terminate the generation of the first and $M^{th}$ internal write output control pulses IWT_POUTP<1:M> if the semiconductor device is out of the bank group mode or the burst length is not set to be '32'.

The bank group selection signal generation circuit 7 may generate first to fourth bank group selection signals BG<1:4> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the first to fourth bank addresses IBA<1:4>. The bank group selection signal generation circuit 7 may store the first to fourth bank addresses IBA<1:4> in response to the first and second read input control pulses RD_PINP<1:2> during the read operation. The bank group selection signal generation circuit 7 may output the first to fourth bank addresses IBA<1:4> as the first to fourth bank group selection signals BG<1:4> in response to the first and second read output control pulses RD_POUTP<1:2> and the first and second internal read output control pulses IRD_POUTP<1:2>. The bank group selection signal generation circuit 7 may store the first to fourth bank addresses IBA<1:4> in response to the first to $M^{th}$ write input control pulses WT_PINP<1:M> during the write operation. The bank group selection signal generation circuit 7 may output the first to fourth bank addresses IBA<1:4> as the first to fourth bank group selection signals BG<1:4> in response to the first to $M^{th}$ write output control pulses WT_POUTP<1:M> and the first to $M^{th}$ internal write output control pulses IWT_POUTP<1:M>.

The bank group address generation circuit 8 may generate first to fourth bank group addresses ADD_BG<1:4> and first to fourth internal bank group addresses IADD_BG<1:4> in response to the read column control pulse RDAYP, the internal read column control pulse IRDAYP, the write column control pulse WTAYP, the internal write column control pulse IWTAYP and the first to fourth bank group selection signals BG<1:4>. The bank group address generation circuit 8 may generate the first to fourth bank group addresses ADD_BG<1:4> and the first to fourth internal bank group addresses IADD_BG<1:4> having logic level combinations according to a bank group performing the column operation in response to the read column control pulse RDAYP, the internal read column control pulse IRDAYP and the first to fourth bank group selection signals BG<1:4> if the read operation is performed. The bank group address generation circuit 8 may generate the first to fourth bank group addresses ADD_BG<1:4> and the first to fourth internal bank group addresses IADD_BG<1:4> having logic level combinations according to a bank group performing the column operation in response to the write column control pulse WTAYP, the internal write column control pulse IWTAYP and the first to fourth bank group selection signals BG<1:4> if the write operation is performed.

The core circuit 9 may receive the first to fourth bank group addresses ADD_BG<1:4> and the first to fourth internal bank group addresses IADD_BG<1:4> to perform the column operation for each of the bank groups. The core circuit 9 may separately perform the column operations for cell arrays selected by the first to fourth bank group addresses ADD_BG<1:4> and the first to fourth internal bank group addresses IADD_BG<1:4> in one bank group. For example, if the read operation or the write operation is performed while the burst length is set to be '32', the column operation for a cell array included in a bank group selected by the first to fourth bank group selection signals BG<1:4> may be divided into two column operations which are separately performed for sixteen-bit data selected by the first to fourth bank group addresses ADD_BG<1:4> and for sixteen-bit data selected by the first to fourth internal bank group addresses IADD_BG<1:4>. In the burst length, '32' means that 32 data are successively read or written whenever the read operation or the write operation is performed once during the column operation.

Figure 2:
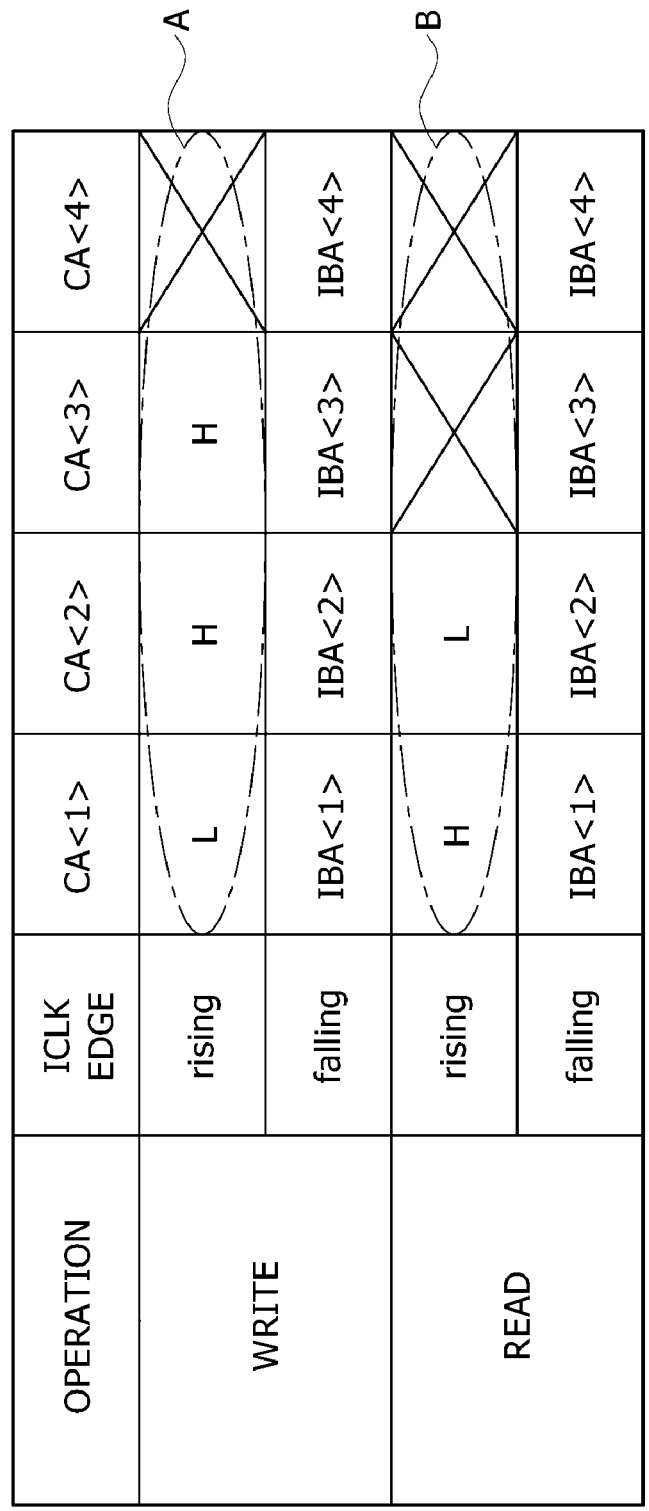
FIG. 2 is a table illustrating various logic level combinations of an external control signal for generating a command pulse and an address used in the semiconductor device of FIG. 1.

Referring to FIG. 2, a command pulse and an address generated according to a logic level combination of first to fourth external control signals CA<1:4> are listed. If the first to fourth external control signals CA<1:4> are set to have a logic level combination of 'A' in synchronization with a rising edge of the internal dock signal ICLK, a command pulse for performing the write operation may be generated. In the first to fourth external control signals CA<1:4>, the logic level combination of 'A' means that a first external control signal CA<1> has a logic "low(L)" level and second and third external control signals CA<2:3> have a logic "high(H)" level. In such a case, a fourth external control signal CA<4> may have a don't care condition. After the command pulse for the write operation is generated, the first to fourth external control signals CA<1:4> inputted to the semiconductor device in synchronization with a falling edge of the internal clock signal ICLK may be generated as the first to fourth bank addresses IBA<1:4> for the write operation. If the first to fourth external control signals CA<1:4> are set to have a logic level combination of '13' in synchronization with a rising edge of the internal clock signal ICLK, a command pulse for performing the read operation may be generated. In the first to fourth external control signals CA<1:4>, the logic level combination of '13' means that the first external control signal CA<1> has a logic "high(H)" level and the second external control signals CA<2> has a logic "low(L)" level. In such a case, the third and fourth external control signals CA<3:4> may have a don't care condition. After the command pulse for the read operation is generated, the first to fourth external control signals CA<1:4> inputted to the semiconductor device in synchronization with a falling edge of the internal clock signal ICLK may be generated as the first to fourth bank addresses IBA<1:4> for the read operation.

Figure 3:
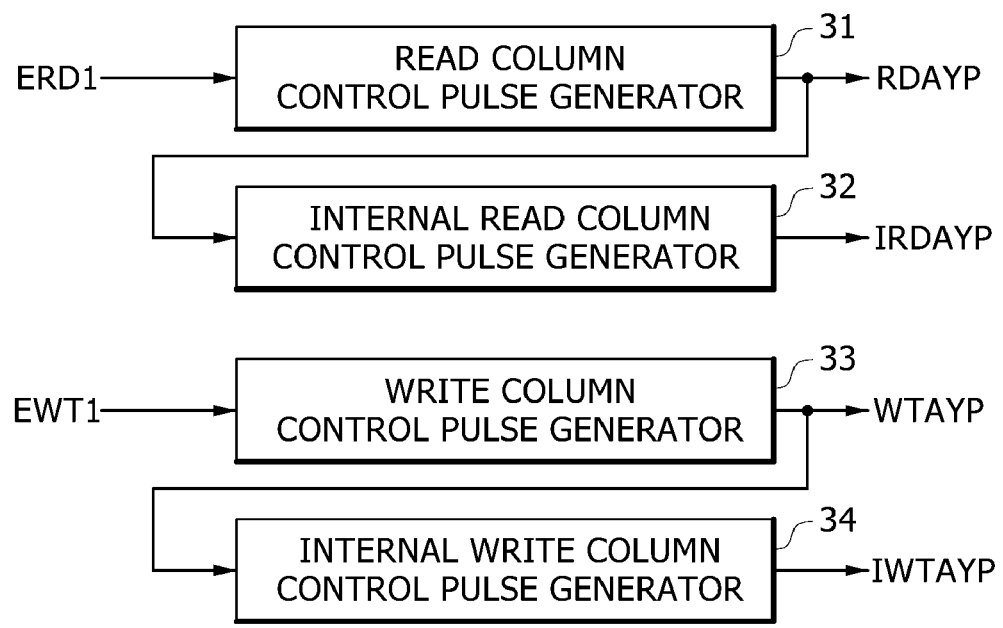
FIG. 3 is a block diagram illustrating a configuration of an example of a column control pulse generation circuit included in the semiconductor device of FIG. 1.

Referring to FIG. 3, the column control puke generation circuit 3 may include a read column control pulse generator 31, an internal read column control pulse generator 32, a write column control pulse generator 33 and an internal write column control pulse generator 34.

The read column control pulse generator 31 may shift the first read command pulse ERD1 by the third predetermined period to generate the read column control pulse RDAYP (i.e., column control pulse). The read column control pulse generator 31 may be configured to shift the first read command pulse ERD1 by the third predetermined period which is set according to the read latency. The internal read column control pulse generator 32 may shift the read column control pulse RDAYP by the fourth predetermined period to generate the internal read column control pulse IRDAYP (i.e., internal column control pulse). The internal read column control pulse generator 32 may be configured to shift the read column control pulse RDAYP by the fourth predetermined period which is set to perform the column operation according to the burst length during the read operation.

The write column control pulse generator 33 may shift the first write command pulse EWT1 by the fifth predetermined period to generate the write column control pulse WTAYP (i.e., column control puke). The write column control pulse generator 33 may be configured to shift the first write command pulse EWT1 by the fifth predetermined period which is set according to the write latency. The internal write column control pulse generator 34 may shift the write column control pulse WTAYP by the sixth predetermined period to generate the internal write column control pulse IWTAYP internal column control pulse). The internal write column control pulse generator 34 may be configured to shift the write column control pulse WTAYP by the sixth predetermined period which is set to perform the column operation according to the burst length during the write operation. The read column control pulse generator 31, the internal read column control pulse generator 32, the write column control pulse generator 33 and the internal write column control pulse generator 34 may be realized using shift registers or delay circuits according to the embodiments.

Figure 4:
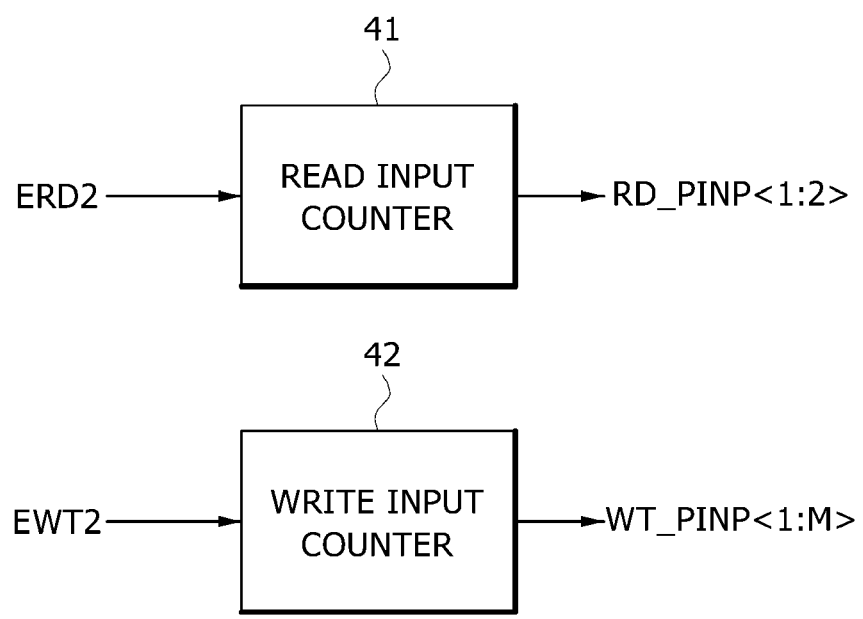
FIG. 4 is a block diagram illustrating a configuration of an example of an input control pulse generation circuit included in the semiconductor device of FIG. 1.

Referring to FIG. 4, the input control pulse generation circuit 4 may include a read input counter 41 and a write input counter 42.

The read input counter 41 may alternately generate the first and second read input control pulses RD_PINP<1:2> whenever the second read command pulse ERD2 occurs. For example, the read input counter 41 may generate the first read input control pulse RD_PINP<1> if the second read command pulse ERD2 occurs first, may generate the second read input control pulse RD_PINP<2> if the second read command pulse ERD2 occurs second, and may generate the first read input control pulse RD_PINP<1> again if the second read command pulse ERD2 occurs third.

The write input counter 42 may alternately and repeatedly generate the first to $M^{th}$ write input control pulses WT_PINP<1:M> whenever the second write command pulse EWT2 occurs. For example, the write input counter 42 may generate the first write input control pulse WT_PINP<1> if the second write command pulse EWT2 occurs first, may generate the second write input control pulse WT_PINP<2> if the second write command pulse EWT2 occurs second, may generate the $M^{th}$, write input control pulse WT_PINP<M> if the second write command pulse EWT2 occurs 'M'$^{th}$, and may generate the first write input control pulse WT_PINP<1> again if the second write command pulse EWT2 occurs '(M+1)th.

Figure 5:
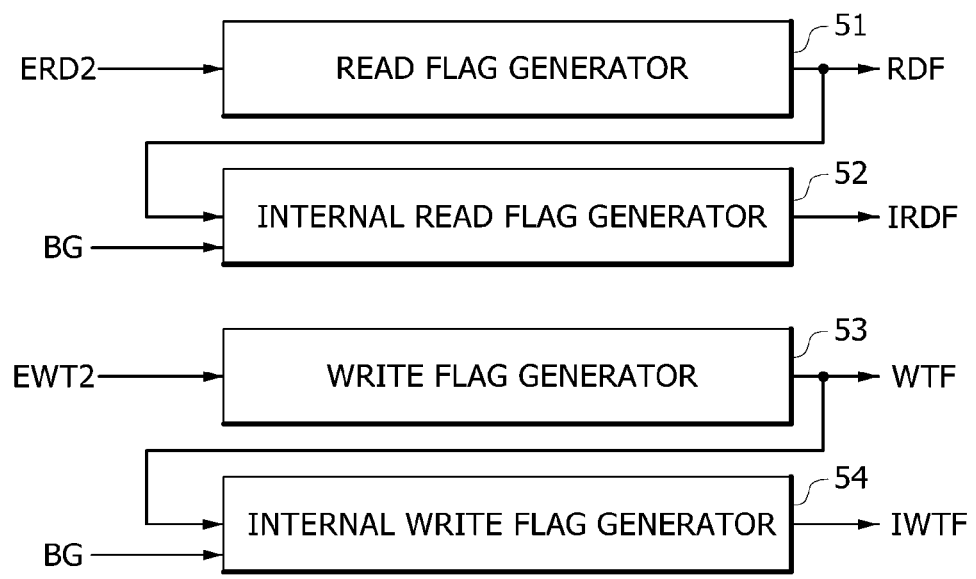
FIG. 5 is a block diagram illustrating a configuration of an example of a flag generation circuit included in the semiconductor device of FIG. 1.

Referring to FIG. 5, the flag generation circuit 5 may include a read flag generator 51, an internal read flag generator 52, a write flag generator 53 and an internal write flag generator 54.

The read flag generator 51 may shift the second read command pulse ERD2 by the seventh predetermined period to generate the read flag RDF. The read flag generator 51 may be configured to shift the second read command pulse ERD2 by the seventh predetermined period which is set according to the read latency. The internal read flag generator 52 may shift the read flag RDF by the eighth predetermined period to generate the internal read flag IRDF if the mode signal BG is enabled in the bank group mode. The internal read flag generator 52 may be configured to shift the read flag RDF by the eighth predetermined period which is set to perform the column operation according to the burst length during the read operation.

The write flag generator 53 may shift the second write command pulse EWT2 by the ninth predetermined period to generate the write flag WTF. The write flag generator 53 may be configured to shift the second write command pulse EWT2 by the ninth predetermined period which is set according to the write latency. The internal write flag generator 54 may shift the write flag WTF by the tenth predetermined period to generate the internal write flag IWTF if the mode signal BG is enabled in the bank group mode. The internal write flag generator 54 may be configured to shift the write flag RDF by the tenth predetermined period which is set to perform the column operation according to the burst length during the write operation. The read flag generator 51, the internal read flag generator 52, the write flag generator 53 and the internal write flag generator 54 may be realized using shift registers or delay circuits according to the embodiments.

Figure 6:
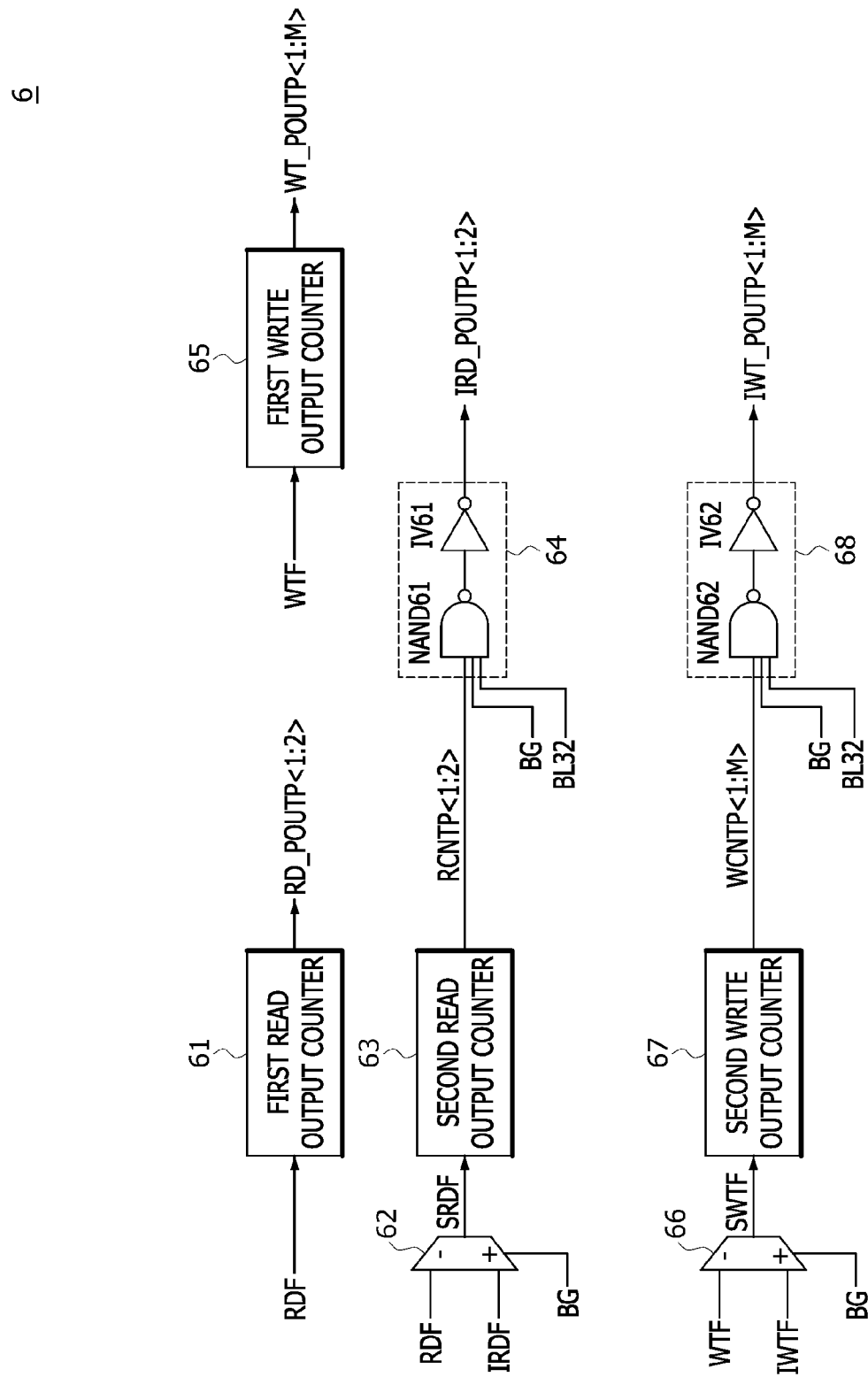
FIG. 6 is a block diagram illustrating a configuration of an example of an output control pulse generation circuit included in the semiconductor device of FIG. 1.

Referring to FIG. 6, the output control pulse generation circuit 6 may include a first read output counter 61, a read selector 62, a second read output counter 63 (i.e., output counter), an internal read output control pulse generation circuit 64, a first write output counter 65, a write selector 66, a second write output counter 67 (i.e., output counter) and an internal write output control pulse generation circuit 68.

The first read output counter 61 may alternately generate the first and second read output control pulses RD_POUTP<1:2> whenever the read flag RDF occurs. For example, the first read output counter 61 may generate the first read output control pulse RD_POUTP<1> if the read flag RDF occurs first, may generate the second read output control pulse RD_POUTP<2> if the read flag RDF occurs second, and may generate the first read output control pulse RD_POUTP<1> again if the read flag RDF occurs third.

The read selector 62 may output the read flag RDF or the internal read flag IRDF as a selection read flag SRDF (i.e. selection flag) in response to the mode signal BG. The read selector 62 may output the read flag RDF as the selection read flag SRDF if the semiconductor device is out of the bank group mode. The read selector 62 may output the internal read flag IRDF as the selection read flag SRDF in the bank group mode. Since the internal read flag IRDF is generated only in the bank group mode, the read selector 62 may output the read flag RDF as the selection read flag SRDF if the semiconductor device is out of the bank group mode. Accordingly, the first and second internal read output control pulses IRD_POUTP<1:2> may be set to be generated by the same number of times as the first and second read output control pulses RD_POUTP<1:2>.

The second read output counter 63 may alternately generate first and second read count pulses RCNTP<1:2> whenever the selection read flag SRDF occurs. For example, the second read output counter 63 may generate the first read count pulse RCNTP<1> if the selection read flag SRDF occurs first, may generate the second read count pulse RCNTP<2> if the selection read flag SRDF occurs second, and may generate the first read count pulse RCNTP<1> again if the selection read flag SRDF occurs third.

The internal read output control pulse generation circuit 64 may perform a NAND operation and an inversion operation. The internal read output control pulse generation circuit 64 may include, for example but not limited to, a NAND gate NAND61 and an inverter IV61. The internal read output control pulse generation circuit 64 (i.e., internal output control pulse generation circuit) may generate the first and second internal read output control pulses IRD_POUTP<1:2> in response to the first and second read count pulses RCNTP<1:2>, the mode signal BG and the burst length signal BL32. The internal read output control pulse generation circuit 64 may buffer the first and second read count pulses RCNTP<1:2> to output the buffered pulses as the first and second internal read output control pulses IRD_POUTP<1:2> if both of the mode signal BG and the burst length signal BL32 are enabled to have a logic "high" level while the burst length is set to be '32' in the bank group mode. The internal read output control pulse generation circuit 64 may terminate the generation of the first and second internal read output control pulses IRD_POUTP<1:2> while the semiconductor device is out of the bank group mode (i.e., the semiconductor device is not operating in the bank group mode) or the burst length is not set to be '32'.

The first write output counter 65 may sequentially and repeatedly generate the first to $M^{th}$ write output control pulses WT_POUTP<1:M> whenever the write flag WTF occurs. For example, the first write output counter 65 may generate the first write output control pulse WT_POUTP<1> if the write flag WTF occurs first, may generate the second write output control pulse WT_POUTP<2> if the write flag WTF occurs second, may generate the $M^{th}$ write output control pulse WT_POUTP<M> if the write flag WTF 'occurs 'M'th, and may generate the first write output control pulse WT_POUTP<1> again if the write flag WTF occurs '(M+1)'th.

The write selector 66 may output the write flag WTF or the internal write flag IWTF as a selection write flag SWTF (i.e., selection flag) in response to the mode signal BG. The write selector 66 may output the write flag WTF as the selection write flag SWTF if the semiconductor device is out of the bank group mode. The write selector 66 may output the internal write flag IWTF as the selection write flag SWTF in the bank group mode (i.e., the semiconductor device is operating in the bank group mode). Since the internal write flag IWTF is generated only in the bank group mode, the write selector 66 may output the write flag WTF as the selection write flag SWTF if the semiconductor device is out of the bank group mode. Accordingly, the first to $M^{th}$ internal write output control pulses IWT_POUTP<1:M> may be set to be generated by the same number of times as the first to $M^{th}$ write output control pulses WT_POUTP<1 M>.

The second write output counter 67 may sequentially and repeatedly generate first to $M^{th}$ write count pulses WCNTP<1:M> whenever the selection write flag SWTF occurs. For example, the second write output counter 67 may generate the first write count pulse WCNTP<1> if the selection write flag SWTF occurs first, may generate the second write count pulse WCNTP<2> if the selection write flag SWTF occurs second, may generate the $M^{th}$ write count pulse WCNTP<M> if the selection write flag SWTF occurs 'M'th, and may generate the first write count pulse WCNTP<1> again if the selection write flag SWTF occurs '(M+1)'th.

The internal write output control pulse generation circuit 68 (i.e., internal output control pulse generation circuit) may perform a NAND operation and an inversion operation. The internal write output control pulse generation circuit 68 may include, for example but not limited to, a NAND gate NAND62 and an inverter IV62. The internal write output control pulse generation circuit 68 may generate the first to $M^{th}$ internal write output control pulses IWT_POUTP<1:M> in response to the first to $M^{th}$ write count pulses WCNTP<1:M>, the mode signal BG and the burst length signal BL32. The internal write output control pulse generation circuit 68 may buffer the first to $M^{th}$ write count pulses WCNTP<1:M> to output the buffered pulses as the first to $M^{th}$ internal write output control pulses IWT_POUTP<1:M> if both of the mode signal BG and the burst length signal BL32 are enabled to have a logic "high" level while the burst length is set to be '32' in the bank group mode. The internal write output control pulse generation circuit 68 may terminate the generation of the first to $M^{th}$ internal write output control pulses IWT_POUTP<1:M> while the semiconductor device is out of the bank group mode or the burst length is not set to be '32'.

Figure 7:
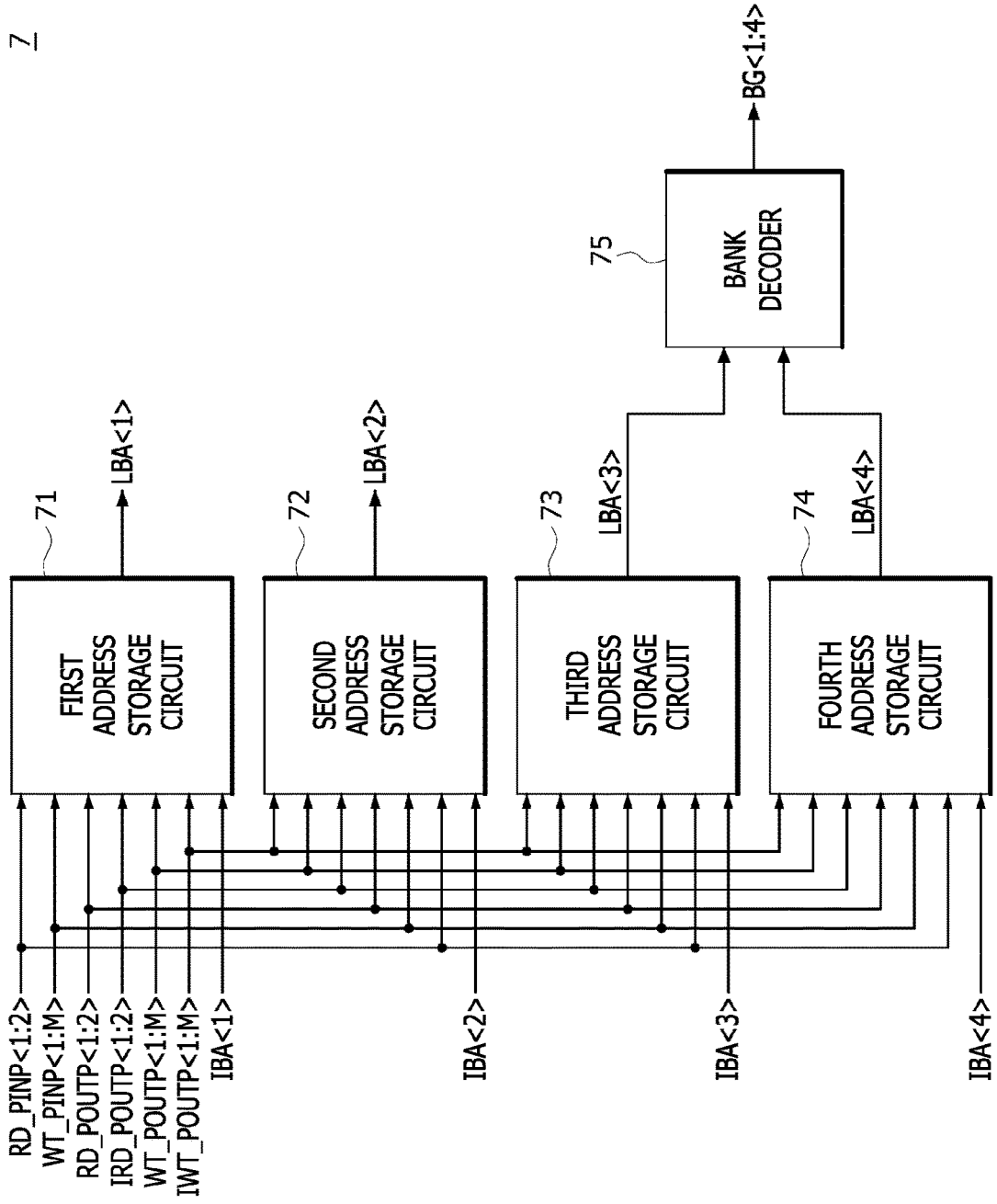
FIG. 7 is a block diagram illustrating a configuration of an example of a bank group selection signal generation circuit included in the semiconductor device of FIG. 1.

Referring to FIG. 7, the bank group selection signal generation circuit 7 may include a first address storage circuit 71, a second address storage circuit 72, a third address storage circuit 73, a fourth address storage circuit 74 and a bank decoder 75. In an embodiment, the second to fourth address storage circuits 72-74 may all have the same configuration as the first address storage circuit 71 except that the input and output signals are respectively different, Thus, for brevity of discussion, the discussion relating to FIG. 8 will only discuss the first address storage circuit 71 for an example on how the other address storage circuits operate.

The first address storage circuit 71 may generate a first latch bank address LBA<1> in response to the first and second read input control pulses RD_PINP<1:2>, the first to $M^{th}$ write input control pukes WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the first bank address IBA<1>. The first address storage circuit 71 may store the first bank address IBA<1> inputted to the first address storage circuit 71 during the read operation in response to the first and second read input control pulses RD_PINP<1:2>. The first address storage circuit 71 may output the first bank address IBA<1> stored therein during the read operation as the first latch bank address LBA<1> in response to the first and second read output control pulses RD_POUTP<1:2> and the first and second internal read output control pulses IRD_POUTP<1:2>. The first address storage circuit 71 may store the first bank address IBA<1> inputted to the first address storage circuit 71 during the write operation in response to the first to $M^{th}$ write input control pulses WT_PINP<1:M>. The first address storage circuit 71 may output the first bank address IBA<1> stored therein during the write operation as the first latch bank address LBA<1> in response to the first to $M^{th}$ write output control pulses WT_POUTP<1:M> and the first to $M^{th}$ internal write output control pulses IWT_POUTP<1:M>.

The second address storage circuit 72 may generate a second latch bank address LBA<2> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the second bank address IBA<2>. The second address storage circuit 72 may store the second bank address IBA<2> inputted to the second address storage circuit 72 during the read operation in response to the first and second read input control pulses RD_PINP<1:2>. The second address storage circuit 72 may output the second bank address IBA<2> stored therein during the read operation as the second latch bank address LBA<2> in response to the first and second read output control pulses RD_POUTP<1:2> and the first and second internal read output control pulses IRD_POUTP<1:2>. The second address storage circuit 72 may store the second bank address IBA<2> inputted to the second address storage circuit 72 during the write operation in response to the first to $M^{th}$ write input control pulses WT_PINP<1:M>. The second address storage circuit 72 may output the second bank address IBA<2> stored therein during the write operation as the second latch bank address LBA<2> in response to the first to $M^{th}$ write output control pulses WT_POUTP<1:M> and the first to $M^{th}$ internal write output control pulses IWT_POUTP<1:M>.

The third address storage circuit 73 may generate a third latch bank address LBA<3> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the third bank address IBA<3>. The third address storage circuit 73 may store the third bank address IBA<3> inputted to the third address storage circuit 73 during the read operation in response to the first and second read input control pulses RD_PINP<1:2>. The third address storage circuit 73 may output the third bank address IBA<3> stored therein during the read operation as the third latch bank address LBA<3> in response to the first and second read output control pulses RD_POUTP<1:2> and the first and second internal read output control pulses IRD_POUTP<1:2>. The third address storage circuit 73 may store the third bank address IBA<3> inputted to the third address storage circuit 73 during the write operation in response to the first to $M^{th}$ write input control pulses WT_PINP<1:M>. The third address storage circuit 73 may output the third bank address IBA<3> stored therein during the write operation as the third latch bank address LBA<3> in response to the first to $M^{th}$ write output control pulses WT_POUTP<1:M> and the first to $M^{th}$ internal write output control pulses IWT_POUTP<1: M>.

The fourth address storage circuit 74 may generate a fourth latch bank address LBA<4> in response to the first and second read input control pulses RD_PINP<1:2>, the first to $M^{th}$ write input control pulses WT_PINP<1:M>, the first and second read output control pulses RD_POUTP<1:2>, the first and second internal read output control pulses IRD_POUTP<1:2>, the first to $M^{th}$ write output control pulses WT_POUTP<1:M>, the first to $M^{th}$ internal write output control pulses IWT_POUTP<1:M> and the fourth bank address IBA<4>. The fourth address storage circuit 74 may store the fourth bank address IBA<4> inputted to the fourth address storage circuit 74 during the read operation in response to the first and second read input control pulses RD_PINP<1:2>. The fourth address storage circuit 74 may output the fourth bank address IBA<4> stored therein during the read operation as the fourth latch bank address LBA<4> in response to the first and second read output control pulses RD_POUTP<1:2> and the first and second internal read output control pulses IRD_POUTP<1:2>. The fourth address storage circuit 74 may store the fourth bank address IBA<4> inputted to the fourth address storage circuit 74 during the write operation in response to the first to $M^{th}$ write input control pulses WT_PINP<1:M>. The fourth address storage circuit 74 may output the fourth bank address IBA<4> stored therein during the write operation as the fourth latch bank address LBA<4> in response to the first to $M^{th}$ write output control pulses WT_POUTP<1:M> and the first to $M^{th}$ internal write output control pulses IWT_POUTP<1:M>.

The bank decoder 75 may generate the first to fourth bank group selection signals BG<1:4> in response to the third latch bank address LBA<3> and the fourth latch bank address LBA<4>. The bank decoder 75 may decode the third latch bank address LBA<3> and the fourth latch bank address LBA<4> to generate the first to fourth bank group selection signals BG<1:4>. The bank decoder 75 may generate the first to fourth bank group selection signals BG<1:4> having a certain logic level combination according to a logic level combination of the third latch bank address LBA<3> and the fourth latch bank address LBA<4>.

Figure 8:
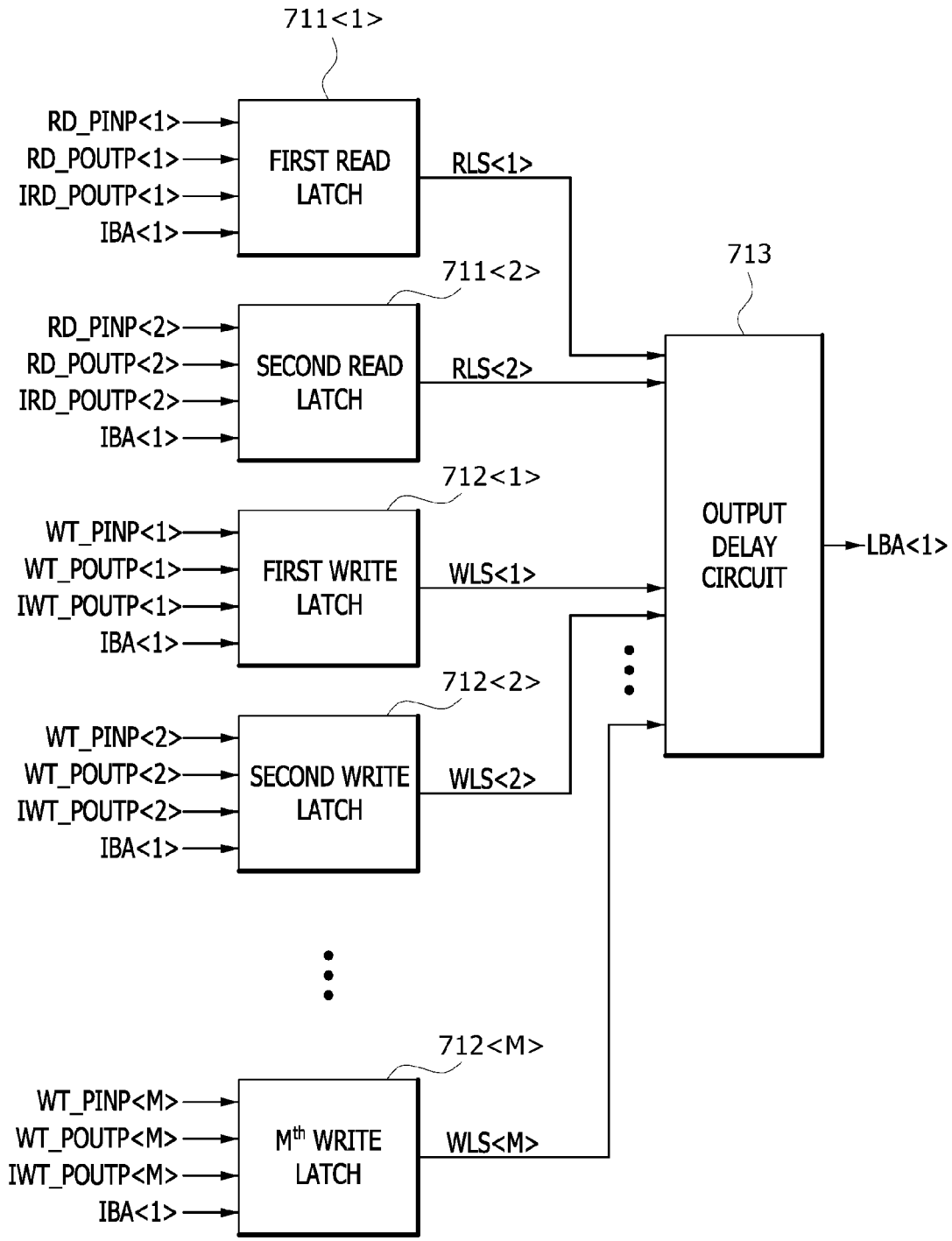
FIG. 8 is a block diagram illustrating a configuration of an example of a first address storage circuit included in the bank group selection signal generation circuit of FIG. 7.

Referring to FIG. 8, the first address storage circuit 71 may include a first read latch 711<1>, a second read latch 711<2>, first to $M^{th}$ write latches 712<1:M> and an output delay circuit 713, In an embodiment, the second read latch 711<2> and first to $M^{th}$ write latches 712<1:M> may all have the same configuration as the first read latch 711<1> except that the input and output signals are respectively different. Thus, for brevity of discussion, the discussion relating to FIG. 9 will only discuss the first read latch 711<1> for an example on how the other read and write latches operate.

The first read latch 711<1> may generate a first read latch signal RLS<1> in response to the first read input control pulse RD_PINP<1>, the first read output control pulse RD_POUTP<1>, the first internal read output control pulse IRD_POUTP<1> and the first bank address IBA<1>, The first read latch 711<1> may latch and store the first bank address IBA<1> if the first read input control pulse RD_PINP<1> occurs. The first read latch 711<1> may output the first bank address IBA<1> stored therein as the first read latch signal RLS<1> if the first read output control pulse RD_POUTP<1> or the first internal read output control pulse IRD_POUTP<1> occurs.

The second read latch 711<2> may generate a second read latch signal RLS<2> in response to the second read input control pulse RD_PINP<2>, the second read output control pulse RD_POUTP<2>, the second internal read output control pulse IRD_POUTP<2> and the first bank address IBA<1>. The second read latch 711<2> may latch and store the first bank address IBA<1> if the second read input control pulse RD_PINP<2> occurs. The second read latch 711<2> may output the first bank address IBA<1> stored therein as the second read latch signal RLS<2> if the second read output control pulse RD_POUTP<2> or the second internal read output control pulse IRD_POUTP<2> occurs. The first write latch 712<1> may generate a first write latch signal WLS<1> in response to the first write input control pulse WT_PINP<1>, the first write output control pulse WT_POUTP<1>, the first internal write output control pulses IWT_POUTP<1> and the first bank address IBA<1>. The first write latch 712<1> may latch and store the first bank address IBA<1> if the first write input control pulse WT_PINP<1> occurs. The first write latch 712<1> may output the first bank address IBA<1> stored therein as the first write latch signal WLS<1> if the first write output control pulse WT_POUTP<1> or the first internal write output control pulses IWT_POUTP<1> occurs.

The second write latch 712<2> may generate a second write latch signal WLS<2> in response to the second write input control pulse WT_PINP<2>, the second write output control pulse WT_POUTP<2>, the second internal write output control pulses IWT_POUTP<2> and the first bank address IBA<1>. The second write latch 712<2> may latch and store the first bank address IBA<1> if the second write input control pulse WT_PINP<2> occurs. The second write latch 712<2> may output the first bank address IBA<1> stored therein as the second write latch signal WLS<2> if the second write output control pulse WT_POUTP<2> or the second internal write output control pulses IWT_POUTP<2> occurs.

The $M^{th}$ write latch 712<M> may generate an $M^{th}$ write latch signal WLS<M> in response to the $M^{th}$ write input control pulse WT_PINP<M>, the $M^{th}$ write output control pulse WT_POUTP<M>, the $M^{th}$ internal write output control pulses IWT_POUTP<M> and the first bank address IBA<1>. The $M^{th}$ write latch 712<M> may latch and store the first bank address IBA<1> if the $M^{th}$ write input control pulse WT_PINP<M> occurs. The $M^{th}$ write latch 712<M> may output the first bank address IBA<1> stored therein as the $M^{th}$ write latch signal WLS<M> if the $M^{th}$ write output control pulse WT_POUTP<M> or the $M^{th}$, internal write output control pulses IWT_POUTP<M> occurs.

The output delay circuit 713 may generate the first latch bank address LBA<1> in response to the first and second read latch signals RLS<1:2> and the first to $M^{th}$ write latch signals WLS<1:M>, The output delay circuit 713 may delay any one of the first and second read latch signals RLS<1:2> and the first to $M^{th}$ write latch signals WLS<1:M> by a predetermined period to generate the first latch bank address LBA<1>. The output delay circuit 713 may delay the first read latch signal RLS<1>, which is generated by occurrence of the first read output control pulse RD_POUTP<1> or the first internal read output control pulse IRD_POUTP<1>, by the predetermined period to generate the first latch bank address LBA<1>. The output delay circuit 713 may delay the second read latch signal RLS<2>, which is generated by occurrence of the second read output control pulse RD_POUTP<2> or the second internal read output control pulse IRD_POUTP<2>, by the predetermined period to generate the first latch bank address LBA<1>, The output delay circuit 713 may delay the first write latch signal WLS<1>, which is generated by occurrence of the first write output control pulse WT_POUTP<1> or the first internal write output control pulse IWT_POUTP<1>, by the predetermined period to generate the first latch bank address LBA<1>. The output delay circuit 713 may delay the second write latch signal WLS<2>, which is generated by occurrence of the second write output control pulse WT_POUTP<2> or the second internal write output control pulse IWT_POUTP<2>, by the predetermined period to generate the first latch bank address LBA<1>. The output delay circuit 713 may delay the $M^{th}$ write latch signal WLS<M>, which is generated by occurrence of the $M^{t}$ write output control pulse WT_POUTP<M> or the $M^{th}$ internal write output control pulse IWT_POUTP<M>, by the predetermined period to generate the first latch bank address LBA<1>.

Figure 9:
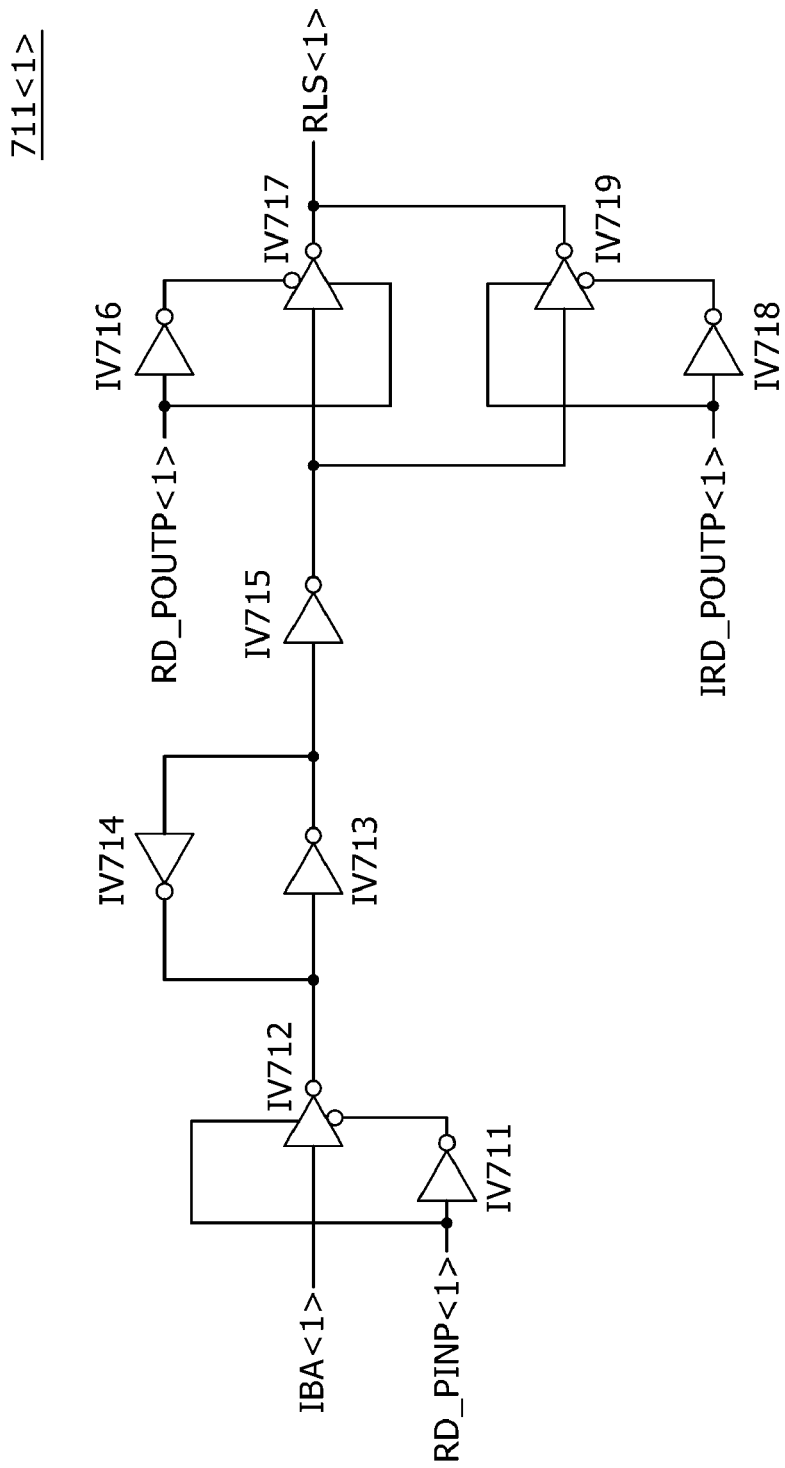
FIG. 9 is a circuit diagram illustrating a configuration of an example of a first read latch included in the first address storage circuit of FIG. 8.

Referring to FIG. 9, the first read latch 711<1> may include inverters IV711, IV712, IV713, IV714, IV715, IV716, IV717, IV718 and IV719. The inverter IV711 may inversely buffer the first read input control pulse RD_PINP<1> and may output the inversely buffered pulse. The inverter IV712 may inversely buffer the first bank address IBA<1> to output the inversely buffered address if the first read input control pulse RD_PINP<1> has a logic "high" level. The inverters IV713 and IV714 may latch and inversely buffer an output signal of the inverter IV712 to output the inversely buffered signal. The inverter IV715 may inversely buffer an output signal of the inverter IV713 to output the inversely buffered signal. The inverter IV716 may inversely buffer the first read output control pulse RD_POUTP<1> to output the inversely buffered signal of the first read output control pulse RD_POUTP<1>. The inverter IV717 may inversely buffer an output signal of the inverter IV715 to output the inversely buffered signal as the first read latch signal RLS<1> if the first read output control pulse RD_POUTP<1> has a logic "high" level. The inverter IV718 may inversely buffer the first internal read output control pulse IRD_POUTP<1> to output the inversely buffered signal of the first internal read output control pulse IRD_POUTP<1>. The inverter IV719 may inversely buffer an output signal of the inverter IV715 to output the inversely buffered signal as the first read latch signal RLS<1> if the first internal read output control pulse IRD_POUTP<1> has a logic "high" level. The first read latch 711<1> may output the first bank address IBA<1> stored therein as the first read latch signal RLS<1> if the first read output control pulse RD_POUTP<1> or the first internal read output control pulse IRD_POUTP<1> occurs.

Figure 10:
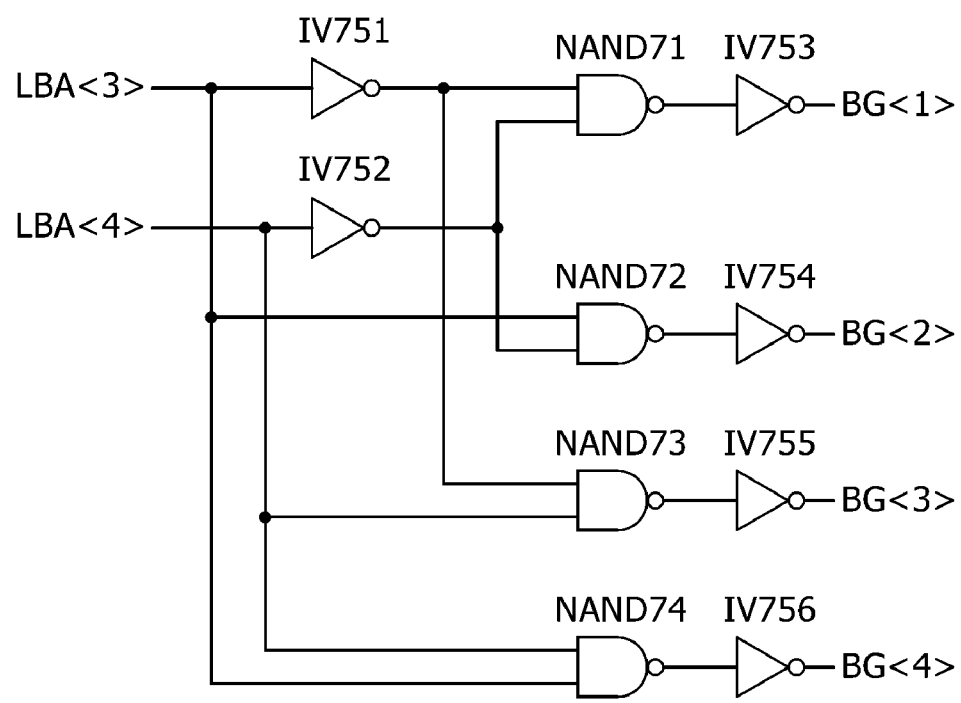
FIG. 10 is a circuit diagram illustrating a configuration of an example of a bank decoder included in the bank group selection signal generation circuit of FIG. 7.

Referring to FIG. 10, the bank decoder 75 may include inverters IV751, IV752, IV753, IV754, IV755 and IV756 and NAND gates NAND71, NAND72, NAND73 and NAND74. The inverter IV751 may inversely buffer the third latch bank address LBA<3> to output the inversely buffered address. The inverter IV752 may inversely buffer the fourth latch bank address LBA<4> to output the inversely buffered address. The NAND gate NAND71 and the inverter IV753 may perform a logical AND operation of an output signal of the inverter IV751 and an output signal of the inverter IV752 to generate the first bank group selection signal BG<1>. The NAND gate NAND72 and the inverter IV754 may perform a logical AND operation of the third latch bank address LBA<3> and an output signal of the inverter IV752 to generate the second bank group selection signal BG<2>. The NAND gate NAND73 and the inverter IV755 may perform a logical AND operation of the fourth latch bank address LBA<4> and an output signal of the inverter IV751 to generate the third bank group selection signal BG<3>. The NAND gate NAND74 and the inverter IV756 may perform a logical AND operation of the third latch bank address LBA<3> and the fourth latch bank address LBA<4> to generate the fourth bank group selection signal BG<4>.

Figure 11:
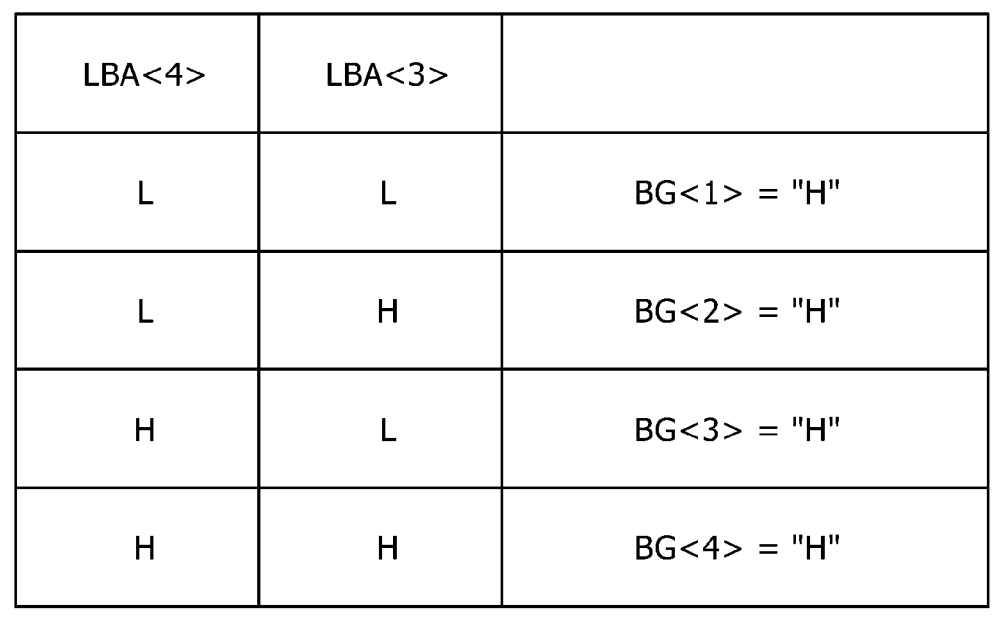

Referring to FIG. 11, the bank group selection signals BG<1:4> enabled according to logic level combinations of the third and fourth latch bank addresses LBA<3:4> are listed. If the third latch bank address LBA<3> has a logic "low" level and the fourth latch bank address LBA<4> has a logic "low" level, the first bank group selection signal BG<1> may be enabled to have a logic "high" level to select a first bank group. If the third latch bank address LBA<3> has a logic "high" level and the fourth latch bank address LBA<4> has a logic "low" level, the second bank group selection signal BG<2> may be enabled to have a logic "high" level to select a second bank group. If the third latch bank address LBA<3> has a logic "low" level and the fourth latch bank address LBA<4> has a logic "high" level, the third bank group selection signal BG<3> may be enabled to have a logic "high" level to select a third bank group. If the third latch bank address LBA<3> has a logic "high" level and the fourth latch bank address LBA<4> has a logic "high" level, the fourth bank group selection signal BG<4> may be enabled to have a logic "high" level to select a fourth bank group.

Figure 12:
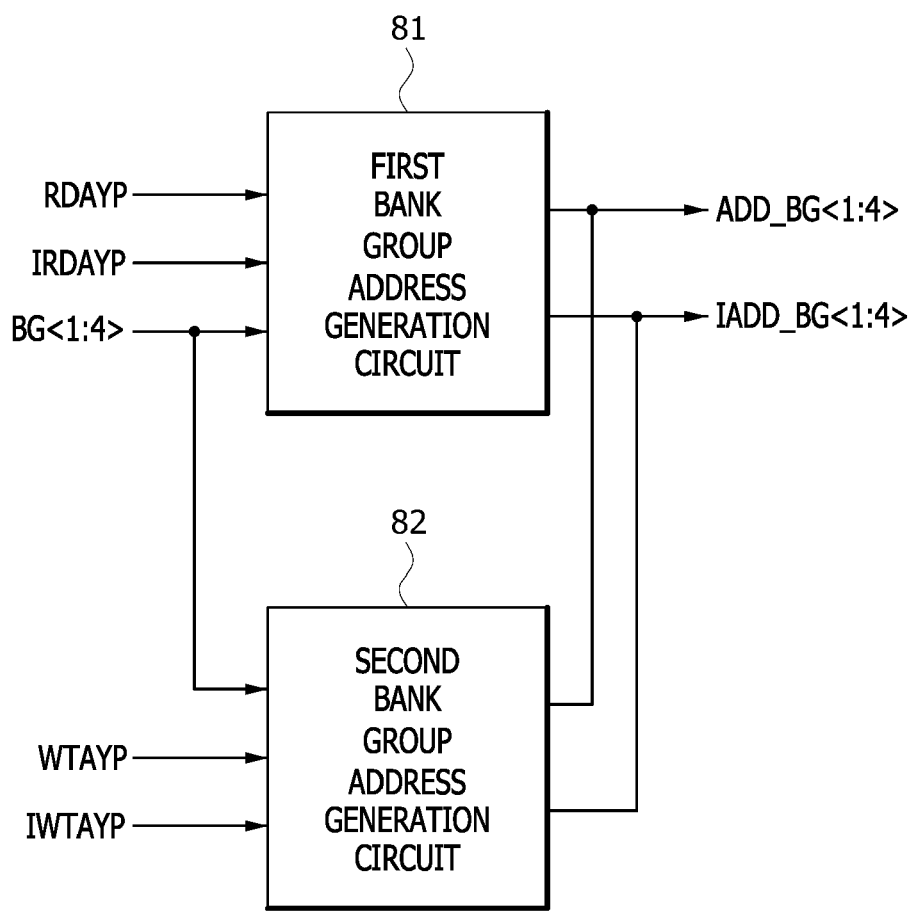
FIG. 12 is a block diagram illustrating a configuration of an example of a bank group address generation circuit included in the semiconductor device of FIG. 1.

Referring to FIG. 12, the bank group address generation circuit 8 may include a first bank group address generation circuit 81 and a second bank group address generation circuit 82.

The first bank group address generation circuit 81 may generate the first to fourth bank group addresses ADD_BG<1:4> and the first to fourth internal bank group addresses IADD_BG<1:4> in response to the read column control pulse RDAYP, the internal read column control pulse IRDAYP and the first to fourth bank group selection signals BG<1:4>. The first bank group address generation circuit 81 may generate the first to fourth bank group addresses ADD_BG<1:4> from the first to fourth bank group selection signals BG<1:4> in response to the read column control pulse RDAYP. The first bank group address generation circuit 81 may buffer the first to fourth bank group selection signals BG<1:4> to generate the first to fourth bank group addresses ADD_BG<1:4> if the read column control pulse RDAYP occurs. In an embodiment, a logic level combination of the first to fourth bank group addresses ADD_BG<1:4> generated by the first bank group address generation circuit 81 may be identical to a logic level combination of the first to fourth bank group selection signals BG<1:4>. However, in another embodiment, a logic level combination of the first to fourth bank group addresses ADD_BG<1:4> generated by the first bank group address generation circuit 81 may be different from a logic level combination of the first to fourth bank group selection signals BG<1:4>. The first bank group address generation circuit 81 may generate the first to fourth internal bank group addresses IADD_BG<1:4> from the first to fourth bank group selection signals BG<1:4> in response to the internal read column control pulse IRDAYP. The first bank group address generation circuit 81 may buffer the first to fourth bank group selection signals BG<1:4> to generate the first to fourth internal bank group addresses IADD_BG<1:4> if the internal read column control pulse IRDAYP occurs. In an embodiment, a logic level combination of the first to fourth internal bank group addresses IADD_BG<1:4> generated by the first bank group address generation circuit 81 may be identical to a logic level combination of the first to fourth bank group selection signals BG<1:4>. However, in another embodiment, a logic level combination of the first to fourth internal bank group addresses IADD_BG<1:4> generated by the first bank group address generation circuit 81 may be different from a logic level combination of the first to fourth bank group selection signals BG<1:4>.

The second bank group address generation circuit 82 may generate the first to fourth bank group addresses ADD_BG<1:4> and the first to fourth internal bank group addresses IADD_BG<1:4> in response to the write column control pulse WTAYP, the internal write column control pulse IWTAYP and the first to fourth bank group selection signals BG<1:4>. The second bank group address generation circuit 82 may generate the first to fourth bank group addresses ADD_BG<1:4> from the first to fourth bank group selection signals BG<1:4> in response to the write column control pulse WTAYP. The second bank group address generation circuit 82 may buffer the first to fourth bank group selection signals BG<1:4> to generate the first to fourth bank group addresses ADD_BG<1:4> if the write column control pulse WTAYP occurs. In an embodiment, a logic level combination of the first to fourth bank group addresses ADD_BG<1:4> generated by the second bank group address generation circuit 82 may be identical to a logic level combination of the first to fourth bank group selection signals BG<1:4>. However, in another embodiment, a logic level combination of the first to fourth bank group addresses ADD_BG<1:4> generated by the second bank group address generation circuit 82 may be different from a logic level combination of the first to fourth bank group selection signals BG<1:4>. The second bank group address generation circuit 82 may generate the first to fourth internal bank group addresses IADD_BG<1:4> from the first to fourth bank group selection signals BG<1:4> in response to the internal write column control pulse IWTAYP. The second bank group address generation circuit 82 may buffer the first to fourth bank group selection signals BG<1:4> to generate the first to fourth internal bank group addresses IADD_BG<1:4> if the internal write column control pulse IWTAYP occurs. In an embodiment, a logic level combination of the first to fourth internal bank group addresses IADD_BG<1:4> generated by the second bank group address generation circuit 82 may be identical to a logic level combination of the first to fourth bank group selection signals BG<1:4>. However, in another embodiment, a logic level combination of the first to fourth internal bank group addresses IADD_BG<1:4> generated by the second bank group address generation circuit 82 may be different from a logic level combination of the first to fourth bank group selection signals BG<1:4>.

Figure 13:
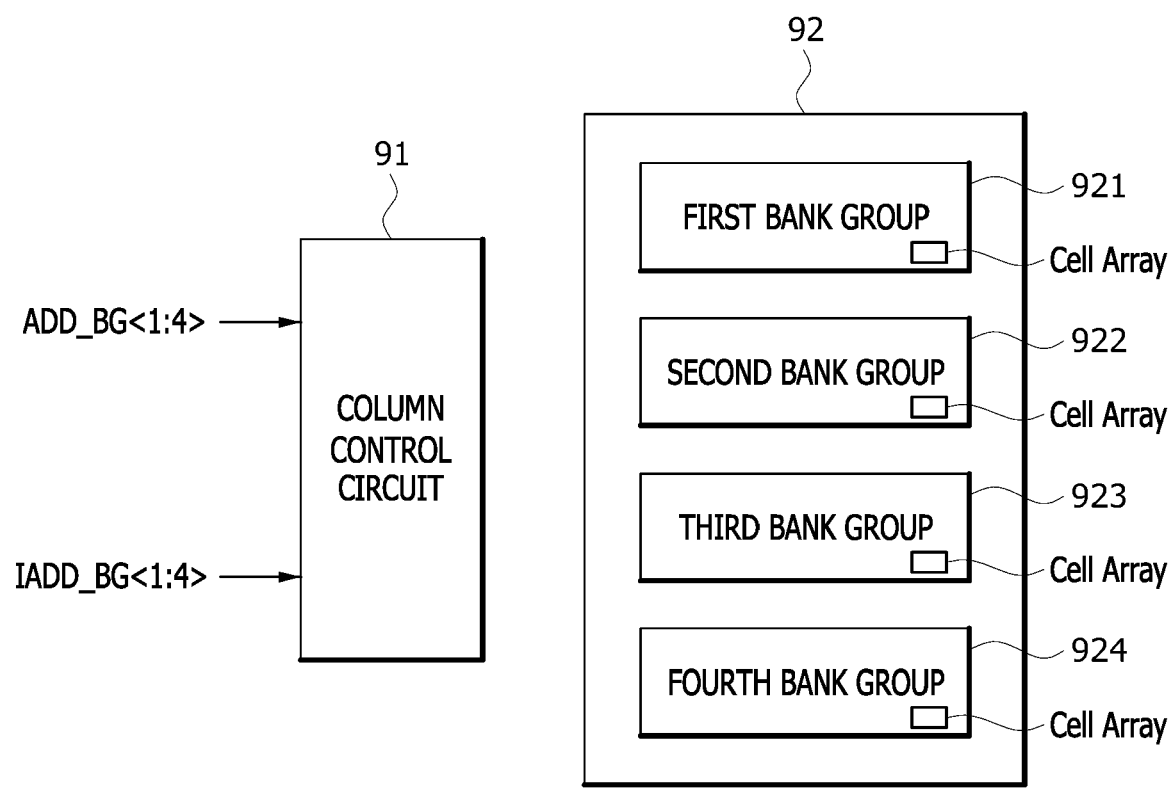
FIG. 13 is a block diagram illustrating a configuration of an example of a core circuit included in the semiconductor device of FIG. 1.

Referring to FIG. 13, the core circuit 9 may include a column control circuit 91 and a memory cell region 92. The column control circuit 91 may control the column operations of cell arrays disposed in first to fourth bank groups 921, 922, 923 and 924 included in the memory cell region 92 in response to the first to fourth bank group addresses ADD_BG<1:4> and the first to fourth internal bank group addresses IADD_BG<1:4>. The column control circuit 91 may sequentially perform the column operations of the cell array included in the first bank group 921 if the first bank group address ADD_BG<1> and the first internal bank group address IADD_BG<1> are sequentially enabled. While the burst length is set to be '32', the column control circuit 91 may perform the column operation for 16-bit data of the cell array included in the first bank group 921 in response to the first bank group address ADD_BG<1> which is enabled and may perform the column operation for 16-bit data of the cell array included in the first bank group 921 in response to the first internal bank group address IADD_BG<1> which is enabled after a certain period elapses. The column control circuit 91 may sequentially perform the column operations of the cell array included in the second bank group 922 if the second bank group address ADD_BG<2> and the second internal bank group address IADD_BG<2> are sequentially enabled. While the burst length is set to be '32', the column control circuit 91 may perform the column operation for 16-bit data of the cell array included in the second bank group 922 in response to the second bank group address ADD_BG<2> which is enabled and may perform the column operation for 16-bit data of the cell array included in the second bank group 922 in response to the second internal bank group address IADD_BG<2> which is enabled after the certain period elapses. The column control circuit 91 may sequentially perform the column operations of the cell array included in the third bank group 923 if the third bank group address ADD_BG<3> and the third internal bank group address IADD_BG<3> are sequentially enabled. While the burst length is set to be '32', the column control circuit 91 may perform the column operation for 16-bit data of the cell array included in the third bank group 923 in response to the third bank group address ADD_BG<3> which is enabled and may perform the column operation for 16-bit data of the cell array included in the third bank group 923 in response to the third internal bank group address IADD_BG<3> which is enabled after the certain period elapses. The column control circuit 91 may sequentially perform the column operations of the cell array included in the fourth bank group 924 if the fourth bank group address ADD_BG<4> and the fourth internal bank group address IADD_BG<4> are sequentially enabled. While the burst length is set to be '32', the column control circuit 91 may perform the column operation for 16-bit data of the cell array included in the fourth bank group 924 in response to the fourth bank group address ADD_BG<4> which is enabled and may perform the column operation for 16-bit data of the cell array included in the fourth bank group 924 in response to the fourth internal bank group address IADD_BG<4> which is enabled after the certain period elapses. The column control circuit 91 may include various circuits to control the column operations of the cell arrays disposed in the first to fourth bank groups 921, 922, 923 and 924 included in the memory cell region 92 in response to the first to fourth bank group addresses ADD_BG<1:4> and the first to fourth internal bank group addresses IADD_BG<1:4>. For example, the column control circuit 91 may include a first circuit for selecting one of the cell arrays included in the first to fourth bank groups 921~924, a second circuit for outputting the data stored in the selected cell array in units of 16 bits, and a third circuit for transmitting the data outputted from the selected cell array to data pads through data paths, in response to the first to fourth bank group addresses ADD_BG<1:4> and the first to fourth internal bank group addresses IADD_BG<1:4>. The first circuit for selecting one of the cell arrays, the second circuit for outputting the data stored in the selected cell array in units determined by the burst length, and the third circuit for transmitting the data outputted from the selected cell array to the data pads may be realized using general circuits. Thus, descriptions of the first to third circuits will be omitted hereinafter.

Figure 14:
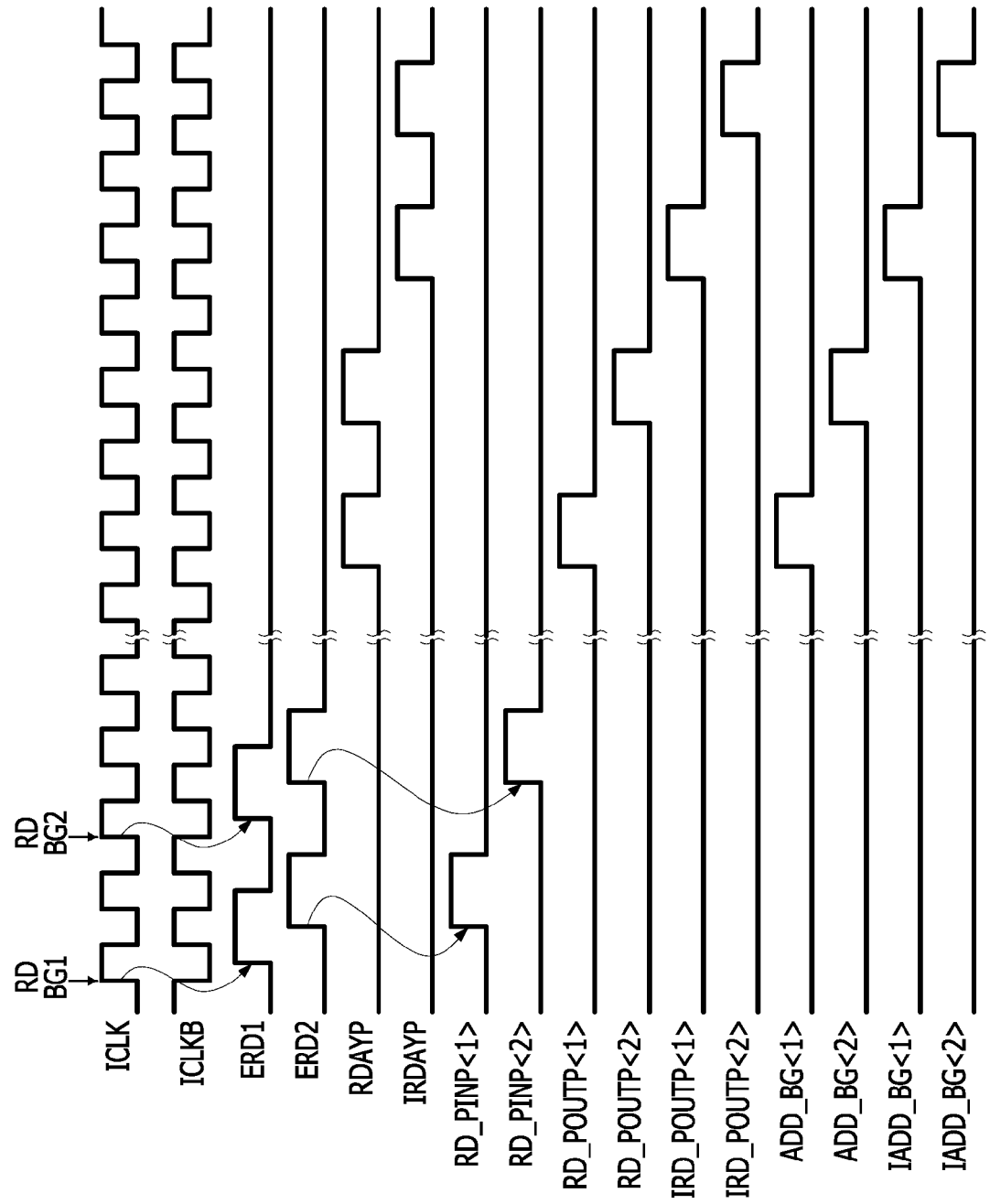
FIGS. 14 and 15 are timing diagrams illustrating operations of the semiconductor device illustrated in FIG. 1.

A read mode of the semiconductor device having an aforementioned configuration will be described hereinafter with reference to FIG. 14 in conjunction with an example in which read operations of the first bank group 921 and the second bank group 922 are sequentially performed while the burst length is set to be '32' in the bank group mode.

If a command for the read operation of the first bank group 921 is inputted to the command pulse generation circuit 1, the first read command pulse ERD1 may be generated in synchronization with the internal clock signal ICLK and the second read command pulse ERD2 may be generated in synchronization with the inverted internal clock signal ICLKB. The first read command pulse ERD1 may be shifted by a period set by the read latency to provide the read column control pulse RDAYP. The read column control pulse RDAYP may be shifted by a period set to perform the column operation according to the burst length to provide the internal read column control pulse IRDAYP. Whenever the second read command pulse ERD2 occurs, the first read input control pulse RD_PINP<1> and the second read input control pulse RD_PINP<2> may be alternately generated. Whenever the second read command pulse ERD2 occurs, the first read output control pulse RD_POUTP<1> and the second read output control pulse RD_POUTP<2> may be alternately generated after the period set by the read latency elapses from a point of time that the second read command pulse ERD2 occurs. Whenever the second read command pulse ERD2 occurs, the first internal read output control pulse IRD_POUTP<1> and the second internal read output control pulse IRD_POUTP<2> may be alternately generated after the period set to perform the column operation according to the burst length elapses from a point of time that the second read command pulse ERD2 occurs. The first bank group address ADD_BG<1> may be generated in synchronization with the first read output control pulse RD_POUTP<1>, the second bank group address ADD_BG<2> may be generated in synchronization with the second read output control pulse RD_POUTP<2>, the first internal bank group address IADD_BG<1> may be generated in synchronization with the first internal read output control pulse IRD_POUTP<1>, and the second internal bank group address IADD_BG<2> may be generated in synchronization with the second internal read output control pulse IRD_POUTP<2>. The column operation for 16-bit data of the cell array included in the first bank group 921 may be performed by the read column control pulse RDAYP created while the first bank group address ADD_BG<1> is generated. The column operation for 16-bit data of the cell array included in the second bank group 922 may be performed by the read column control pulse RDAYP created while the second bank group address ADD_BG<2> is generated. The column operation for 16-bit data of the cell array included in the first bank group 921 may be performed by the internal read column control pulse IRDAYP created while the first internal bank group address IADD_BG<1> is generated. The column operation for 16-bit data of the cell array included in the second bank group 922 may be performed by the internal read column control pulse IRDAYP created while the second internal bank group address IADD_BG<2> is generated.

Figure 15:
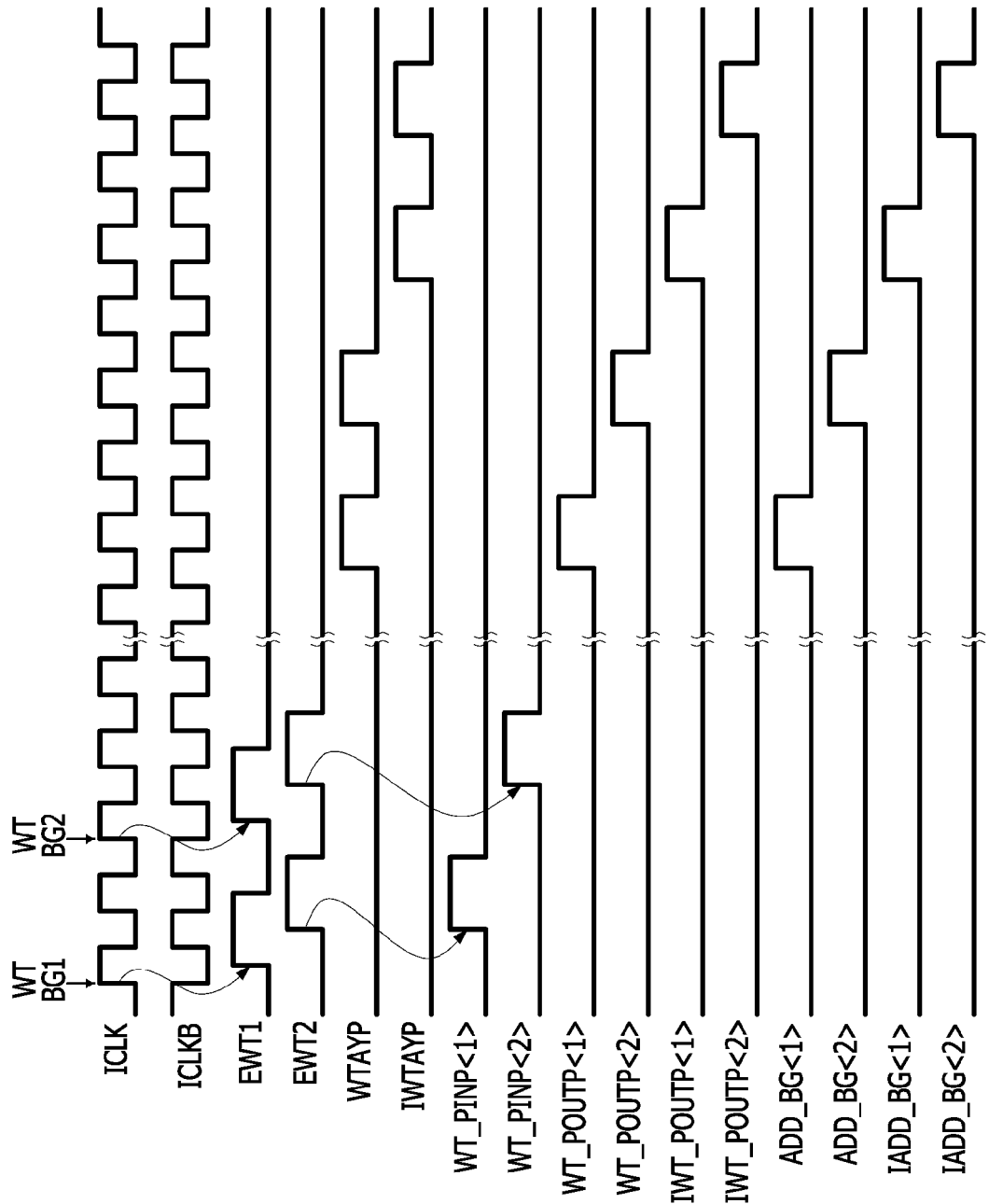

A write mode of the semiconductor device having an aforementioned configuration will be described hereinafter with reference to FIG. 15 in conjunction with an example in which write operations of the first bank group 921 and the second bank group 922 are sequentially performed while the burst length is set to be '32' in the bank group mode.

If a command for the write operation of the first bank group 921 is inputted to the command pulse generation circuit 1 the first write command pulse EWT1 may be generated in synchronization with the internal clock signal ICLK and the second write command puke EWT2 may be generated in synchronization with the inverted internal clock signal ICLKB. The first write command pulse EWT1 may be shifted by a period set by the read latency to provide the write column control pulse WTAYP, The write column control pulse WTAYP may be shifted by a period set to perform the column operation according to the burst length to provide the internal write column control pulse IWTAYP. Whenever the second write command pulse EWT2 occurs, the first write input control pulse WT_PINP<1> and the second write input control pulse WT_PINP<2> may be alternately generated. Whenever the second write command pulse EWT2 occurs, the first write output control pulse WT_POUTP<1> and the second write output control pulse WT_POUTP<2> may be alternately generated after the period set by the read latency elapses from a point of time that the second write command pulse EWT2 occurs, Whenever the second write command pulse EWT2 occurs, the first internal write output control pulse IWT_POUTP<1> and the second internal write output control pulse IWT_POUTP<2> may be alternately generated after the period set to perform the column operation according to the burst length elapses from a point of time that the second write command pulse EWT2 occurs. The first bank group address ADD_BG<1> may be generated in synchronization with the first write output control pulse WT_POUTP<1>, the second bank group address ADD_BG<2> may be generated in synchronization with the second write output control pulse WT_POUTP<2>, the first internal bank group address IADD_BG<1> may be generated in synchronization with the first internal write output control pulse IWT_POUTP<1>, and the second internal bank group address IADD_BG<2> may be generated in synchronization with the second internal write output control pulse IWT_POUTP<2>. The column operation for 16-bit data of the cell array included in the first bank group 921 may be performed by the write column control pulse WTAYP created while the first bank group address ADD_BG<1> is generated. The column operation for 16-bit data of the cell array included in the second bank group 922 may be performed by the write column control pulse WTAYP created while the second bank group address ADD_BG<2> is generated. The column operation for 16-bit data of the cell array included in the first bank group 921 may be performed by the internal write column control pulse IWTAYP created while the first internal bank group address IADD_BG<1> is generated. The column operation for 16-bit data of the cell array included in the second bank group 922 may be performed by the internal write column control pulse IWTAYP created while the second internal bank group address IADD_BG<2> is generated.

As described above, a semiconductor device according to an embodiment may separately perform column operations for a cell array included in a bank group accessed by first to fourth bank addresses IBA<1:4>. This may lead to reduction of the column operation time and the electric power consumption during the column operations. In addition, the semiconductor device according to an embodiment may store the first to fourth bank addresses IBA<1:4> to separately perform the column operations. Accordingly, the column operations may be efficiently performed.

Figure 16:
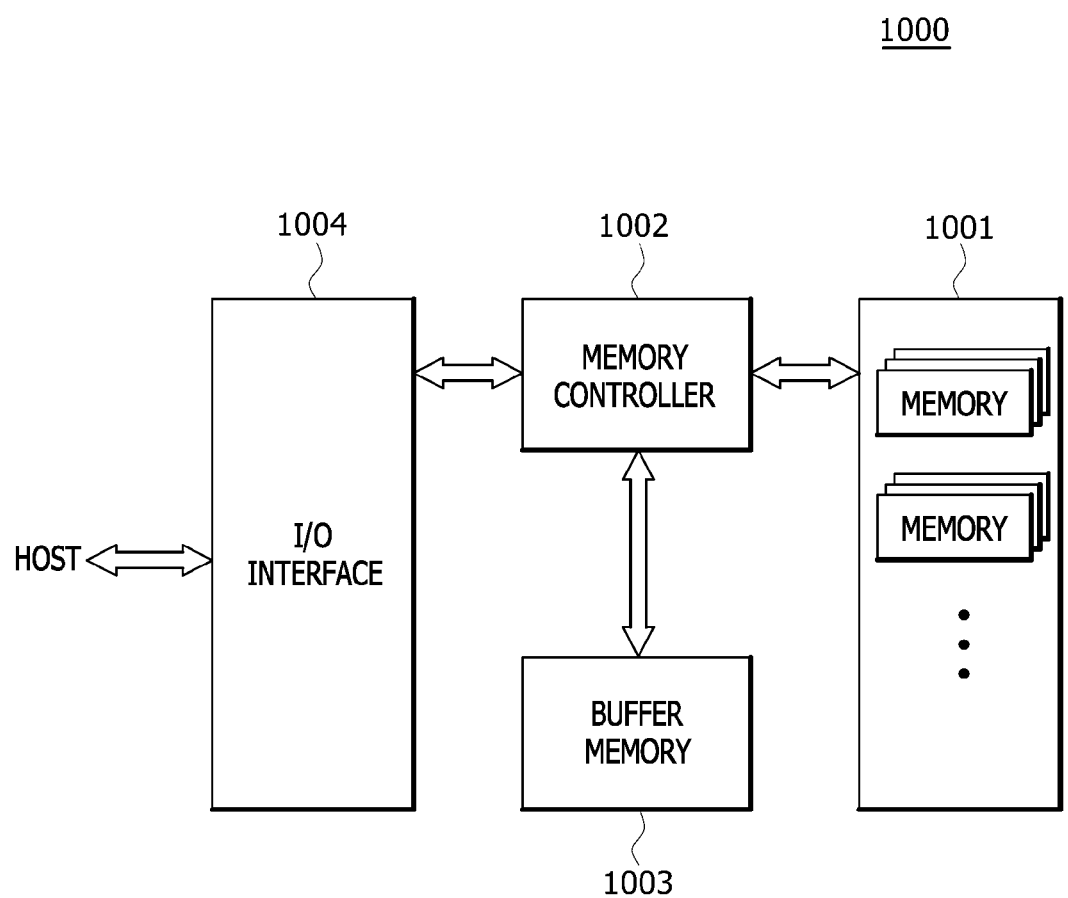
FIG. 16 is a block diagram illustrating a configuration of an electronic system employing the semiconductor device illustrated in FIG. 1.

The semiconductor devices described with reference to FIGS. 1 to 15 may be applied to an electronic system that include a memory system, a graphic system, a computing system, a mobile system, or the like. For example, as illustrated in FIG. 16, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor devices illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 16 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002, The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a bank group selection signal generation circuit configured to store a bank address based on a command pulse generated to perform a read operation or a write operation and configured to output the stored bank address as a bank group selection signal at a moment different from a moment that the bank address is stored;
a bank group address generation circuit configured to generate a bank group address and an internal bank group address for performing a column operation of a cell array included in a bank group selected based on the bank group selection signal; and
an output control pulse generation circuit configured to generate an output control pulse and an internal output control pulse for controlling an operation for the bank address that is outputted from the bank group selection signal generation circuit, based on the command pulse,
wherein an interval between points of time that the output control pulse and the internal output control pulse are generated is set by a period for performing the column operation according to a burst length.

2. The semiconductor device of claim 1, wherein the command pulse is generated by decoding an external control signal in synchronization with an internal clock signal or an inverted internal clock signal.

3. The semiconductor device of claim 1,
wherein the command pulse includes a first read command pulse, a first write command pulse, a second read command pulse and a second write command pulse;
wherein the first read command pulse is generated by decoding an external control signal in synchronization with an internal clock signal to perform the read operation;
wherein the first write command pulse is generated by decoding the external control signal in synchronization with the internal clock signal to perform the write operation;
wherein the second read command pulse is generated by decoding the external control signal in synchronization with an inverted internal clock signal to perform the read operation; and
wherein the second write command pulse is generated by decoding the external control signal in synchronization with the inverted internal clock signal to perform the write operation.

4. The semiconductor device of claim 1,
wherein the bank group selection signal is enabled at a first point of time and is enabled again at a second point of time after the first point of time; and
wherein an interval between the first point of time and the second point of time is set by a period for performing the column operation according to a burst length.

5. The semiconductor device of claim 1,
wherein the bank group selection signal generation circuit is configured to output the stored bank address as the bank group selection signal at a first point of time and is configured to output the stored bank address as the bank group selection signal at a second point of time after the first point of time; and
wherein the bank group address generation circuit is configured to generate the bank group address at the first point of time and is configured to generate the internal bank group address at the second point of time.

6. The semiconductor device of claim 1, further comprising an input control pulse generation circuit configured to generate an input control pulse for controlling an operation for the bank address that is inputted to the bank group selection signal generation circuit, based on the command pulse.

7. The semiconductor device of claim 6, wherein bits of data included in the input control pulse are sequentially generated based on an occurrence of the command pulse.

8. The semiconductor device of claim 1, wherein the internal output control pulse is generated if the burst length is set to have a predetermined value in a bank group mode for the column operation of one bank being performed by one command.

9. The semiconductor device of claim 1, further comprising a column control pulse generation circuit configured to generate a column control pulse and an internal column control pulse for controlling the column operation of the cell array included in the selected bank group, based on the command pulse.

10. The semiconductor device of claim 1, further comprising a core circuit configured to include a plurality of bank groups for performing the column operation based on the bank group address and the internal bank group address,
wherein the selected bank group is one of the plurality of bank groups.

11. A semiconductor device comprising:
a bank group selection signal generation circuit configured to store a bank address based on a command pulse generated to perform a read operation or a write operation and configured to output the stored bank address as a bank group selection signal at a moment different from a moment that the bank address is stored;
a bank group address generation circuit configured to generate a bank group address and an internal bank group address for performing a column operation of a cell array included in a bank group selected based on the bank group selection signal; and
an output control pulse generation circuit configured to generate an output control pulse and an internal output control pulse from a flag and an internal flag, which are generated from the command pulse, based on a mode signal and a burst length signal.

12. The semiconductor device of claim 11,
wherein the mode signal is enabled in a bank group mode for the column operation of one bank being performed by one command; and
wherein the internal flag is generated if the mode signal is enabled.

13. The semiconductor device of claim 11, wherein the output control pulse generation circuit includes:
a selector configured to output the flag or the internal flag as a selection flag based on the mode signal;
an output counter configured to generate a count pulse in response to the selection flag; and
an internal output control pulse generation circuit configured to generate the internal output control pulse from the count pulse in response to the mode signal and the burst length signal.

14. The semiconductor device of claim 13, wherein the output counter generates the count pulse in a bank group mode for the column operation of one bank being performed by one command.

15. A semiconductor device comprising:
- an input control pulse generation circuit configured to generate an input control pulse based on a command pulse;
- an output control pulse generation circuit configured to generate an output control pulse and an internal output control pulse in response to the command pulse; and
- a bank group selection signal generation circuit configured to store a bank address based on the input control pulse and configured to receive the output control pulse and the internal output control pulse to output the stored bank address as a bank group selection signal at a moment different from a moment that the bank address is stored,
- wherein the input control pulse controls an input operation for the bank address being inputted to the bank group selection signal generation circuit,
- wherein the output control pulse and the internal output control pulse control an operation for the bank address being outputted from the bank group selection signal generation circuit, and
- wherein an interval between points of time that the output control pulse and the internal output control pulse are generated is set by a period for performing a column operation according to a burst length.

16. The semiconductor device of claim 15, wherein bits of data included in the input control pulse are sequentially generated based on an occurrence of the command pulse.

17. The semiconductor device of claim 15, wherein bits of data included in each of the output control pulse and the internal output control pulse are sequentially generated based on an occurrence of the command pulse.

18. The semiconductor device of claim 15, wherein the command pulse is generated by decoding an external control signal in synchronization with an internal clock signal or an inverted internal clock signal.

19. The semiconductor device of claim 15,
- wherein the command pulse includes a first read command pulse, a first write command pulse, a second read command pulse and a second write command pulse;
- wherein the first read command pulse is generated by decoding an external control signal in synchronization with an internal clock signal to perform a read operation;
- wherein the first write command pulse is generated by decoding the external control signal in synchronization with the internal clock signal to perform a write operation;
- wherein the second read command pulse is generated by decoding the external control signal in synchronization with an inverted internal clock signal to perform the read operation; and
- wherein the second write command pulse is generated by decoding the external control signal in synchronization with the inverted internal clock signal to perform the write operation.

20. The semiconductor device of claim 15, wherein the output control pulse generation circuit is configured to generate the output control pulse and the internal output control pulse from a flag and an internal flag based on a mode signal and the burst length signal.

21. The semiconductor device of claim 20,
- wherein the mode signal is enabled in a bank group mode for a column operation of one bank being performed by one command; and
- wherein the internal flag is generated if the mode signal is enabled.

22. The semiconductor device of claim 20, wherein the output control pulse generation circuit includes:
- a selector configured to output the flag or the internal flag as a selection flag based on the mode signal;
- an output counter configured to generate a count pulse in response to the selection flag; and
- an internal output control pulse generation circuit configured to generate the internal output control pulse from the count pulse in response to the mode signal and the burst length signal.

23. The semiconductor device of claim 22, wherein the output counter generates the count pulse in a bank group mode for a column operation of one bank being performed by one command.

24. The semiconductor device of claim 15, further comprising a column control pulse generation circuit configured to generate a column control pulse and an internal column control pulse for controlling a column operation of a cell array included in a bank group selected based on the command pulse.

25. The semiconductor device of claim 15, further comprising a bank group address generation circuit configured to generate a bank group address and an internal bank group address for performing a column operation of a cell array included in a bank group selected based on the bank group selection signal.

26. The semiconductor device of claim 25,
- wherein the bank group selection signal generation circuit is configured to output the stored bank address as the bank group selection signal at a first point of time and is configured to output the stored bank address as the bank group selection signal at a second point of time after the first point of time; and
- wherein the bank group address generation circuit is configured to generate the bank group address at the first point of time and is configured to generate the internal bank group address at the second point of time.

* * * * *